US006805769B2

(12) United States Patent
Okuda et al.

(10) Patent No.: US 6,805,769 B2
(45) Date of Patent: Oct. 19, 2004

(54) SUBSTRATE PROCESSING APPARATUS

(75) Inventors: Seiichiro Okuda, Kyoto (JP); Hiroaki Sugimoto, Kyoto (JP)

(73) Assignee: Dainippon Screen Mfg. Co., Ltd., Kyoto (JP)

( * ) Notice: Subject to any disclaimer, the term of this patent is extended or adjusted under 35 U.S.C. 154(b) by 280 days.

(21) Appl. No.: 09/973,182

(22) Filed: Oct. 10, 2001

(65) Prior Publication Data

US 2002/0043275 A1 Apr. 18, 2002

(30) Foreign Application Priority Data

Oct. 13, 2000 (JP) .................................... P2000-313496

(51) Int. Cl.[7] ...................... H01L 21/027; H01L 21/304

(52) U.S. Cl. .............. 156/345.12; 134/113; 156/345.33

(58) Field of Search ....................... 156/345.33, 345.34, 156/345.29, 345.38, 345.26, 345.12; 134/113, 345.18, 345.21

(56) References Cited

U.S. PATENT DOCUMENTS

| | | | | |
|---|---|---|---|---|
| 4,968,375 A | * | 11/1990 | Sato et al. | 156/345.23 |
| 5,608,943 A | * | 3/1997 | Konishi et al. | 15/302 |
| 5,871,584 A | * | 2/1999 | Tateyama et al. | 118/323 |
| 5,952,050 A | * | 9/1999 | Doan | 427/336 |
| 6,247,479 B1 | * | 6/2001 | Taniyama et al. | 134/95.2 |
| 6,453,916 B1 | * | 9/2002 | Tran et al. | 134/58 R |
| 6,669,809 B2 | * | 12/2003 | Hashimoto et al. | 156/345.2 |

FOREIGN PATENT DOCUMENTS

| | | |
|---|---|---|
| JP | 63-190679 | 8/1988 |
| JP | 64-61917 | 3/1989 |
| JP | 4-206626 | 7/1992 |
| JP | 11-40557 | 2/1999 |
| JP | 2948055 | 7/1999 |

* cited by examiner

*Primary Examiner*—P. Hassanzadel
*Assistant Examiner*—Sylvia R. MacArthur
(74) *Attorney, Agent, or Firm*—McDermott Will & Emery LLP

(57) ABSTRACT

Reaction products produced under dry etching attach to a substrate undergoing dry etching. It is necessary to remove the reaction products for the next step. Therefore, in the case of the background art, the processing of supplying a remover for reaction products, an intermediate rinse for washing away the remover, and deionized water to a substrate in order is performed.

The above processing is conventionally performed under an atmospheric atmosphere. Therefore, a thin film may be changed in quality due to atmospheric components.

Therefore, a substrate processing apparatus of the present invention uses means for blowing nitrogen gas on a substrate and supplies a remover to the substrate while blowing nitrogen. Thereby, it is possible to prevent a thin film from being changed in quality due to atmospheric components.

18 Claims, 16 Drawing Sheets

SUBSTRATE PROCESSING APPARATUS

BACKGROUND OF THE INVENTION

1. Field of the Invention

The present invention relates to a substrate processing apparatus for removing organic matter on a substrate.

Moreover, the present invention relates to a substrate processing apparatus for removing a various reaction products due to a resist.

Furthermore, the present invention relates to a substrate processing apparatus for removing a reaction product produced on a substrate through a dry-etching step of dry-etching a thin film present on the surface of the substrate by using a resist film as a mask from the substrate.

2. Description of the Background Art

A semiconductor-device fabrication process includes a step in which a metallic thin film made of aluminum or copper formed on a substrate such as a semiconductor wafer is etched by using a resist film as a mask and used for the wiring of a semiconductor device.

For example, as shown in FIG. 16A, a device 102 is formed on a substrate 101 and a metallic film 103 is formed on the device 102 and the substrate 101. The metallic film 103 is made of, for example, aluminum.

Then, a resist film 104 is formed on the metallic film 103. The resist film 104 is obtained by coating a resist to the upper face of the metallic film 103 and drying the resist, exposing a wiring pattern to the dried resist by an exposure system, supplying a developer to the exposed resist, and dissolving and removing unnecessary portions. Thereby, only a necessary portion of the metallic film 103 is masked by the resist film 104 and left in the next etching step without being etched.

Then, by applying dry etching such as RIE (reactive ion etching) to the metallic film 103 masked by the resist film 104, portions not masked by the resist film 104 in the metallic film 103 are removed through etching and a portion left without being etched becomes a metallic wiring 106.

Thus, by executing dry etching, a reaction product 105 resulting from the resist film 104 or the like is deposited at a side of the metallic wiring 106 as shown in FIG. 16B.

The reaction product 105 is not usually removed in the following resist removing step but it remains on the substrate 101 as shown in FIG. 16C even after removing the resist film 104.

If the substrate 101 is sent to the next step without removing the reaction product 105, reaction affects the processing quality from the next step downward. Therefore, it is necessary to remove the product 105 before it is sent to the next step.

Hence, a conventional substrate processing apparatus has remover supplying means for supplying a remover for a reaction product to a substrate, intermediate-rinse supplying means for supplying an intermediate rinse such as an organic solvent having a function for washing away a remover to the substrate, and deionized-water supplying means for supplying deionized water to the substrate and washing the substrate with deionized water.

In the case of the substrate processing apparatus of conventional type, the environment around a substrate when processing the substrate is not controlled. Therefore, because a thin film continuously contacts the atmosphere, it is changed in quality due to an atmospheric component and the quality of the substrate may be deteriorated.

SUMMARY OF THE INVENTION

The present invention is directed to a substrate processing apparatus for removing an organic matter from a substrate by a remover for the organic matter.

According to the present invention, the substrate processing apparatus for removing an organic matter from a substrate by a remover for the organic matter, comprises a holding-and-rotating section for holding and rotating a substrate, a remover supplying section for supplying a remover for removing an organic matter to the substrate held by the holing-and-rotating section, and a gas supplying section for supplying an inert gas to the substrate held by the holding-and-rotation section.

Because a gas supplying section for supplying an inert gas to a substrate is included, it is possible to reduce the contact between the substrate and the atmosphere. Therefore, it is possible to prevent a thin film on a substrate from being changed in quality.

Preferably, according to a first aspect of the present invention, the remover supplying section has a remover supplying tube for discharging a remover to a substrate, and the gas supplying section has a gas supplying tube for blowing an inert gas on a substrate.

Preferably, according to a second aspect of the present invention, the gas supplying section is provided with a gas nozzle having a slit-like gas-blowing port for blowing an inert gas along the surface of the substrate held by the holding-and-rotating section and the gas nozzle is set to a side of the substrate held by the holding-and-rotating section.

The present invention is also directed to a substrate processing method for removing an organic matter from a substrate by a remover for the organic matter.

Therefore, it is an object of the present invention to prevent a thin film on a substrate from being changed in quality due to an atmospheric component when performing the processing for removing an organic matter from the substrate.

These and other objects, features, aspects, and advantages of the present invention will become more apparent from the following detailed description of the present invention when taken in conjunction with the accompanying drawings.

DESCRIPTION OF THE PREFERRED EMBODIMENTS

In the case of the following preferred embodiments, a substrate denotes a semiconductor substrate, more particularly a silicon substrate. Moreover, the substrate has a thin film. The thin film is a metallic film or an insulating film. A metal constituting the metallic film includes copper, aluminum, titanium, and tungsten. The insulating film uses a silicon oxide film or silicon nitride film. In this case, the thin film includes not only a film whose height is smaller than the bottom length but also a film whose height in the cross section is larger than the bottom length. Therefore, a wiring on the substrate is also included in the thin film.

A polymer which is a reaction product resulting from a resist or thin film is produced on a substrate passing through a step of dry-etching the thin film by using a resist film as a mask.

The substrate processing used for the following preferred embodiments denotes a polymer removal processing for removing a polymer from the substrate with the polymer produced on it.

Moreover, the remover used for the following preferred embodiments is a polymer remover. The polymer remover is a liquid for selectively removing only a polymer, which includes a liquid containing an organic alkali liquid, a liquid containing an inorganic acid, and a liquid containing ammnonium-fluoride-based substance. Among these liquids, DMF (dimethylformamide), DMSO (dimethylsulfoxide), or hydroxylamine is used as the liquid containing organic alkali liquid. Moreover, hydrofluoric acid or phosphoric acid is used as the liquid containing inorganic acid.

Moreover, examples of the polymer remover are liquids containing 1-methyl-2-pyrrolidone, tetrahydrothiophene1.1-dioxide, isopropanolamine, monoethanolamine, 2-(2aminoethoxy)ethanol, catechol, N-methylpyrrolidone, aromatic diol, perphene, and phenol, and, more specifically, a mixed solution of 1-methyl-2-pyrrolidone, tetrahydrothiophene1.1-dioxide, and isopropanolamine, a mixed solution of dimethyl sulfoxide and monoethanolamine, a mixed solution of 2-(2aminoethoxy) ethanol, hydroxyamine, and catechol, a mixed solution of 2-(2aminoethoxy)ethanol and N-methylpyrrolidone, a mixed solution of monoethanolamine, water, and aromatic diol, and a mixed solution of perphene and phenol.

Moreover, the intermediate rinse used for the following preferred embodiments is a liquid for washing away a remover from a substrate, which can use an organic solvent. The organic solvent can use isopropyl alcohol (IPA). Moreover, the intermediate rinse can use ozone water obtained by dissolving ozone in deionized water or hydrogen water obtained by dissolving hydrogen in deionized water.

Furthermore, in the following preferred embodiments, remover, intermediate rinse, and deionized water are generally referred to as treatment liquid.

<1. First Preferred Embodiment of Substrate Processing Apparatus>

A first preferred embodiment of a substrate processing apparatus of the present invention is described below.

Figure 1:
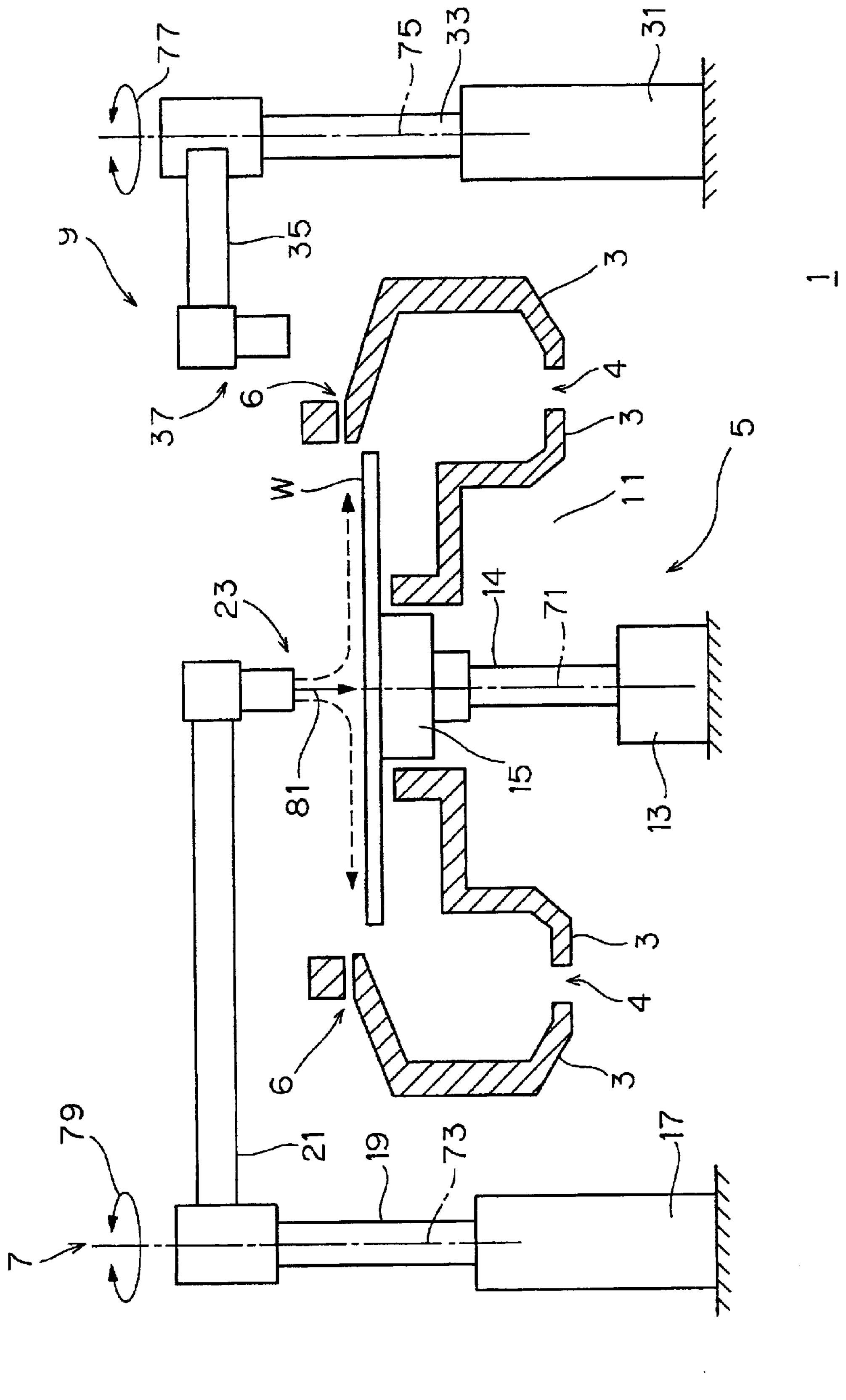
FIG. 1 is a side view of a substrate processing apparatus of a first preferred embodiment of the present invention.
Figure 2:
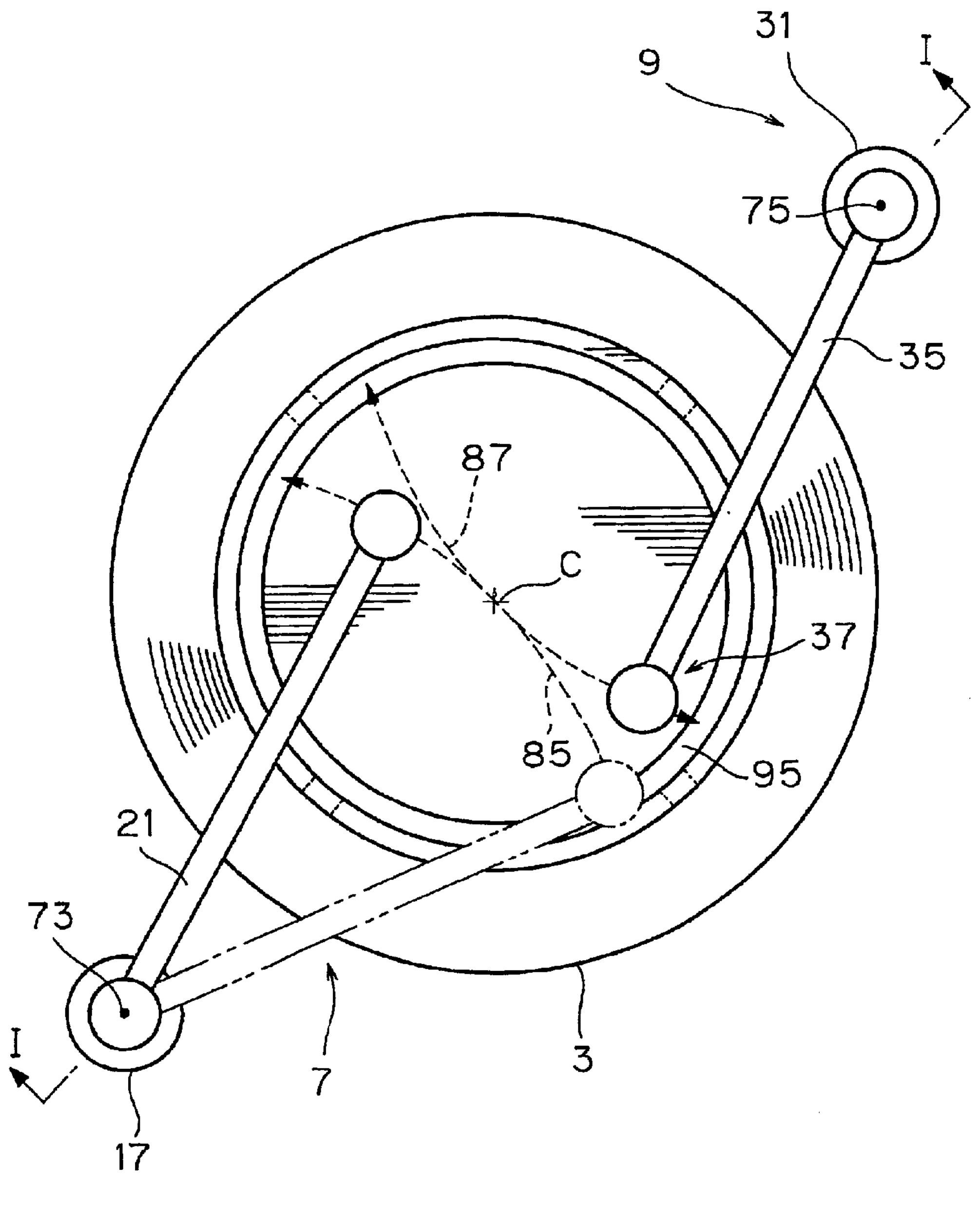
FIG. 2 is a top view of the substrate processing apparatus of the first preferred embodiment of the present invention.

FIGS. 1 and 2 show a substrate processing apparatus 1. FIG. 1 is an I—I sectional view of FIG. 2 and hatching is locally omitted for convenience's sake.

The substrate processing apparatus 1 has an almost U-shaped cross section as shown in FIG. 1. In the top view in FIG. 2, the apparatus 1 comprises an almost-annular cup 3 having an opening at the center, a holding-and-rotating section 5 vertically set through the opening at the center of the cup 3 to hold and rotate a substrate W as shown in FIG. 1, a remover supplying section 7 for supplying a remover to the substrate W held by the holding-and-rotating section 5, and a deionized-water supplying section 9 for supplying deionized water to the substrate W held by the holding-and-rotating section 5.

The cup 3 has a plurality of discharge ports 4 at its bottom. Moreover, extra liquid supplied to the substrate W reaches the discharge ports 4 after passing through the inner wall of the cup 3 and is discharged to the outside of the apparatus from the discharge ports 4. Moreover, a plurality of exhaust ports 6 are opened on the cup 3. The exhaust ports 6 are openings formed toward the substrate W at a height almost equal to the horizontal height of the surface of the substrate W and connected to exhaust means constituted by a not-illustrated exhaust pump to exhaust a gas nearby the substrate W to the outside of the cup 3.

The holding-and-rotating section 5 has a driving shaft vertically set and moreover has a spin motor 13 fixed to a not-illustrated machine casing, a spin shaft 14 fixed to the driving shaft of the spin motor 13, and a vacuum chuck 15 set to the top of the spin shaft 14 to serve as a substrate holding member.

The vacuum chuck 15 has a suction face for sucking a substrate on its upper face and has a not-illustrated suction hole on the suction face. Moreover, by aspirating air through the suction hole, the chuck 15 almost horizontally holds the substrate W.

The holding-and-rotating section 5 holds the substrate W mounted on the vacuum chuck 15 and drives the spin motor 13 to rotate the substrate W about a shaft 71.

The remover supplying section 7 has a driving shaft vertically set and has a first motor 17 fixed to a not-illustrated machine casing, a first rotation shaft 19 fixed to the driving shaft of the first motor 17, a first arm 21 connected to the top of the first rotation shaft 19, and a remover nozzle body 23 set to the front end of the first arm 21.

The remover nozzle body 23 is fixed to the first arm 21 while axial directions of an inner tube 42 and an outer tube 38 to be described later are vertically set.

Moreover, when the first arm 21 reciprocally rotates about a shaft 73 as shown by an arrow 79, the remover nozzle body 23 is fixed to the first arm 21 so that a remover 81 discharged from the remover nozzle body 23 moves on an circular arc 85 in FIG. 2. In this case, the circular arc 85 shows a circular arc passing through the rotation center C of the substrate W and intersecting at two points on the circumference of a turning circle 95 which is drawn by a locus of the edge of the rotated substrate W.

The deionized-water supplying section 9 handles not a remover but only deionized water as a treatment liquid and has a structure almost same as that of the remover supplying section 7.

The deionized-water supplying section 9 has a second motor 31 having a driving shaft vertically fixed to a not-illustrated machine casing, a second rotation shaft 33 fixed to the driving shaft of the second motor 31, a second arm 35 connected to the top of the second rotation shaft 33, and a deionized-water nozzle body 37 set to the front end of the second arm 35.

The deionized-water nozzle body 37 is fixed to the second arm 35 while axial directions of an inner tube 42 and an outer tube 38 to be described later are vertically set.

Moreover, when the second arm 35 reciprocally rotates about the shaft 75 as shown by an arrow 77, the deionized-water nozzle body 37 is fixed to the second arm 35 so that deionized water discharged from the deionized-water nozzle body 37 moves on a circular arc 87 in FIG. 2. In this case, the circular arc 87 shows a circular arc passing through the rotation center C of the substrate W and intersecting at two points on the circumference of the turning circle 95 which is drawn by a locus of the edge of the rotated substrate W.

<1-1. Double-tube Nozzle>

Figure 3:
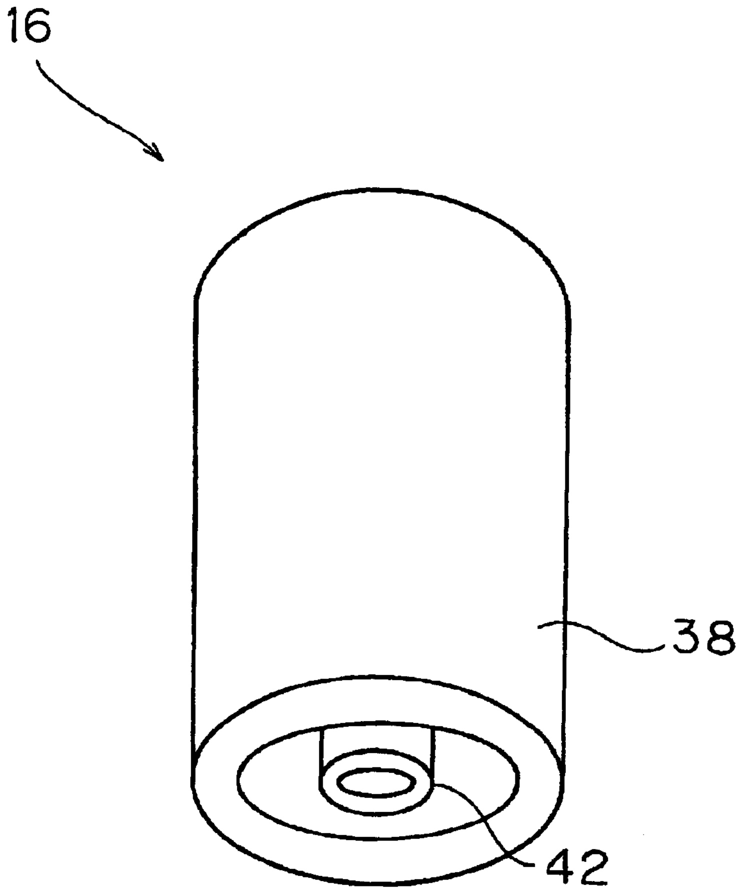
FIG. 3 is a perspective view of a double-tube nozzle.

Then, a double-tube nozzle 16 is described below by referring to FIG. 3. The double-tube nozzle 16 is constituted by a cylindrical inner tube 42 having a determined outside diameter and a cylindrical outer tube 38 having an inside diameter larger than the outside diameter of the inner tube 42 and has a structure in which the inner tube 42 is set in the outer tube 38 and the inner tube 42 is coaxial with the outer tube 38. Moreover, the outer tube 38 can discharge fluid from the gap with the inner tube 42.

<1-2. Remover Supplying System 89 and Deionized-water Supplying System 91>

Figure 4:
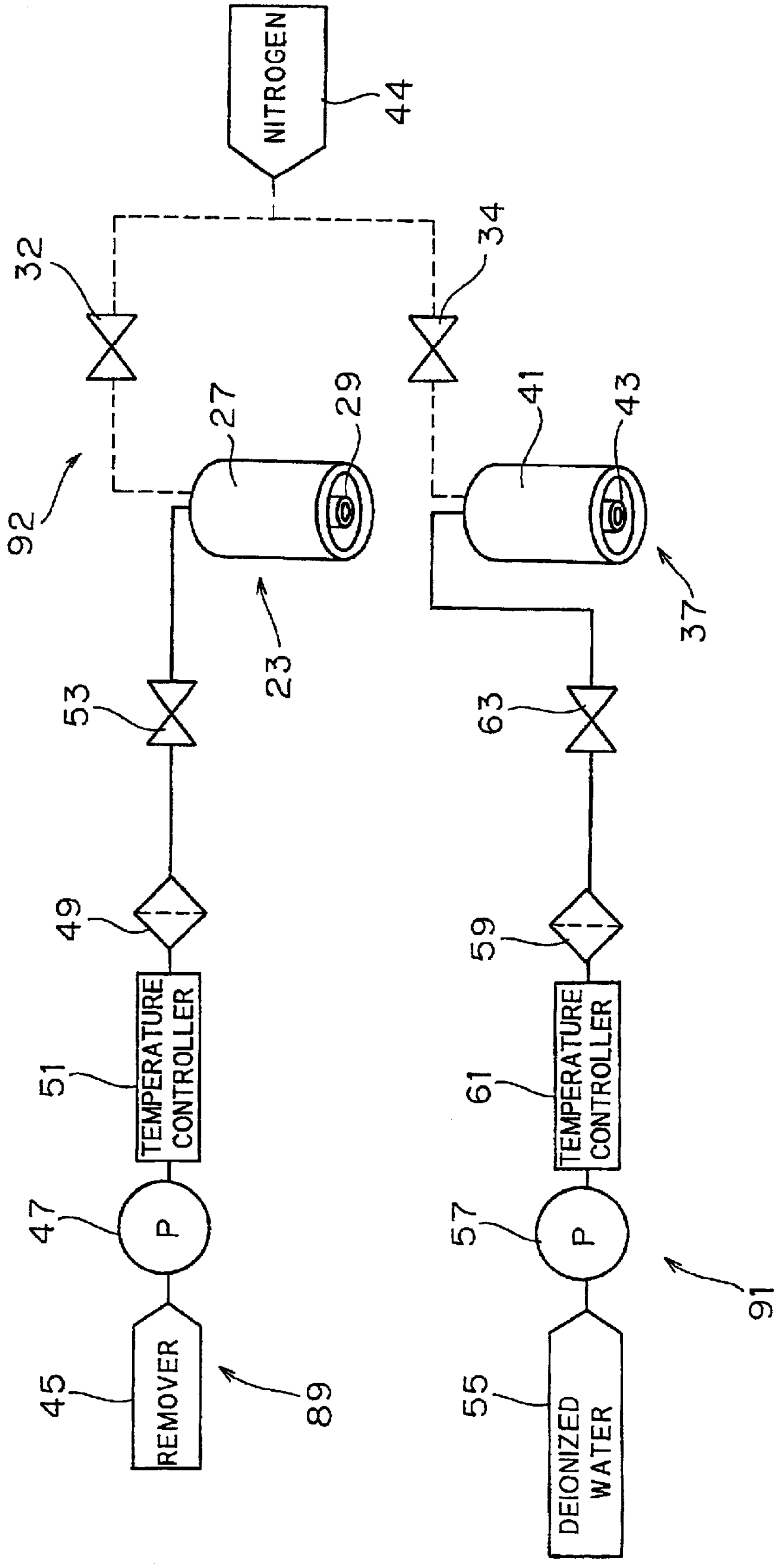
FIG. 4 is a piping diagram of the substrate processing apparatus of the first preferred embodiment of the present invention.

Then, the remover supplying system 89 to the remover supplying section 7 and the deionized-water supplying system 91 to the deionized-water supplying section 9 are described below by referring to FIG. 4.

In this case, the above-described double-tube nozzle 16 is used as the remover nozzle body 23, and the outer tube 38 is set to a first gas supplying tube 27 for blowing nitrogen and the inner tube 42 is set to a remover supplying tube 29 for discharging a remover.

Moreover, the double-tube nozzle 16 is also used as the deionized-water nozzle body 37, and the outer tube 38 is set to a second gas supplying tube 41 for blowing nitrogen and the inner tube 42 is set to a deionized-water supplying tube 43 for discharging deionized water.

The remover supplying system 89 has a remover pump 47 for pumping out a remover from a remover source 45 outside of an apparatus, a temperature controller 51 for controlling the temperature of the remover pumped out by the pump 47 by heating or cooling the remover to a predetermined temperature, a filter 49 for filtering contaminants from the remover temperature-controlled by the temperature controller 51, and a remover supplying valve 53 for opening or closing the channel of the filtered remover to the remover supplying section 7.

According to the above configuration, the remover supplying system 89 supplies the remover which is temperature-controlled to a predetermined temperature by the temperature controller 51 and purified by the filter 49 to the remover supplying tube 29 of the remover supplying section 7.

The deionized-water supplying system 91 has a deionized-water pump 57 for pumping out deionized water from a deionized-water source 55 outside of the apparatus, a temperature controller 61 for controlling the temperature of the deionized water pumped out by the pump 57 by heating or cooling the deionized water to a predetermined temperature, a filter 59 for filtering contaminants from the deionized water temperature-controlled by the temperature controller 61, and a deionized-water supplying valve 63 for opening or closing the channel of the filtered deionized water to the deionized-water supplying section 9.

According to the above configuration, the deionized-water supplying system 91 supplies the deionized-water which is temperature-controlled to a predetermined temperature by the temperature controller 61 and purified by the filter 59 to the deionized-water supplying tube 43 of the deionized-water supplying section 9.

<1-3. Gas Supplying Section 92>

Then, the gas supplying section 92 is described below by referring to FIG. 4.

The gas supplying section 92 has a first nitrogen valve 32 inserted into a duct extended to the first gas supplying tube 27 serving as the outer tube of the remover nozzle body 23 from the nitrogen source 44 for supplying nitrogen and a second nitrogen valve 34 inserted into a duct extended to the second gas supplying tube 41 serving as the outer tube of the deionized-water nozzle body 37 from the nitrogen source 44. According to the above configuration, it is possible to execute or stop blowing nitrogen from the first gas supplying tube 27, more minutely from the gap between the first gas supplying tube 27 and the remover supplying tube 29 by opening or closing the first nitrogen valve 32. Moreover, by opening or closing the second nitrogen valve 34, it is possible to execute or stop blowing nitrogen from the second gas supplying tube 41, more minutely from the gap between the second gas supplying tube 41 and the deionized-water supplying tube 43.

Figure 5:
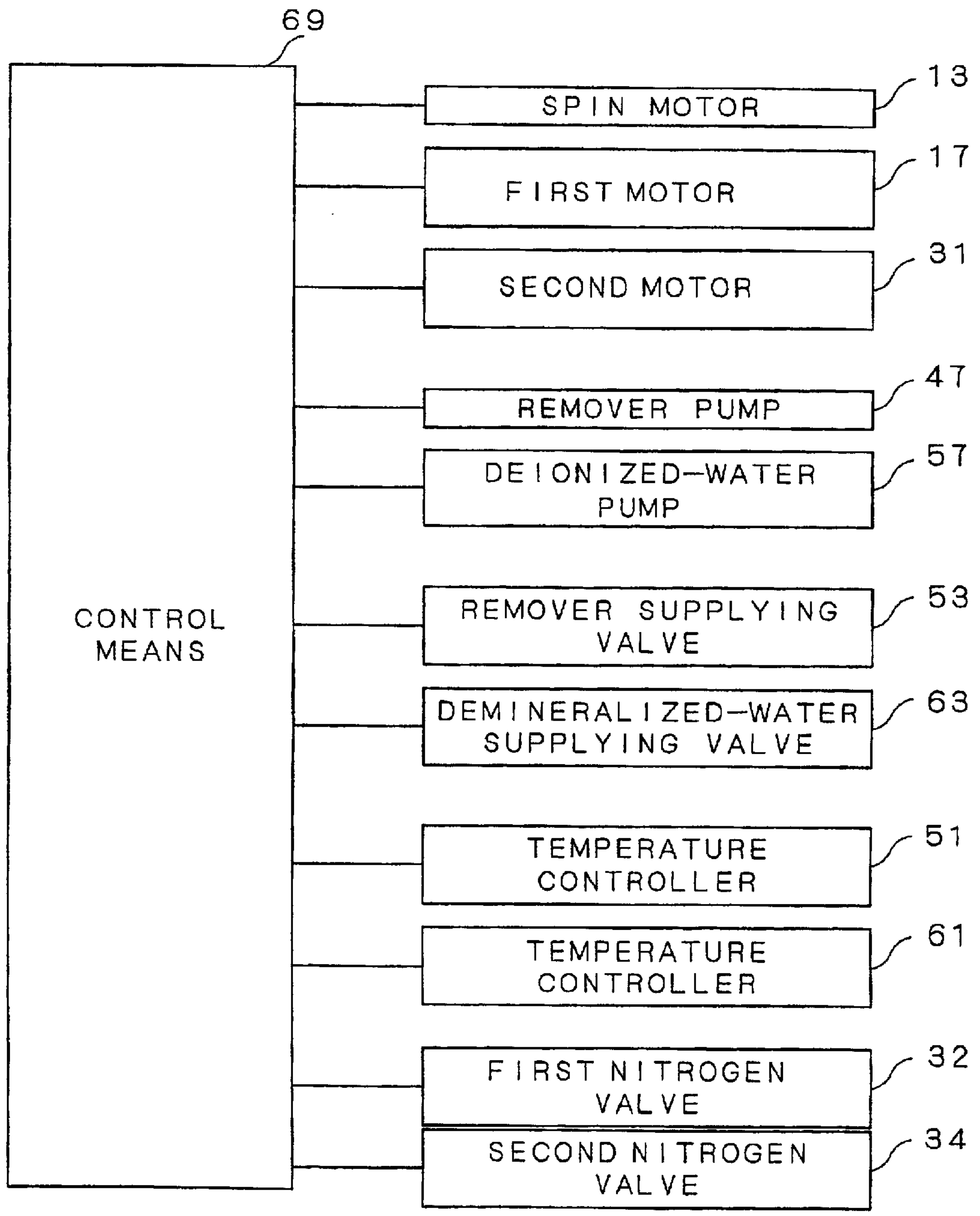
FIG. 5 is an illustration showing an electrical configuration of the substrate processing apparatus of the first preferred embodiment of the present invention.

Then, an electrical configuration of the substrate processing apparatus 1 is described below by referring to FIG. 5.

Controlling means 69 connects with the spin motor 13, first motor 17, second motor 31, remover pump 47, deionized-water pump 57, remover supplying valve 53, deionized-water supplying valve 63, temperature controllers 51 and 61, first nitrogen valve 32, and second nitrogen valve 34. The controlling means 69 controls these connected units as described for the first preferred embodiment of a substrate processing method to be described later.

<2. First Preferred Embodiment of Substrate Processing Method>

Figure 6:
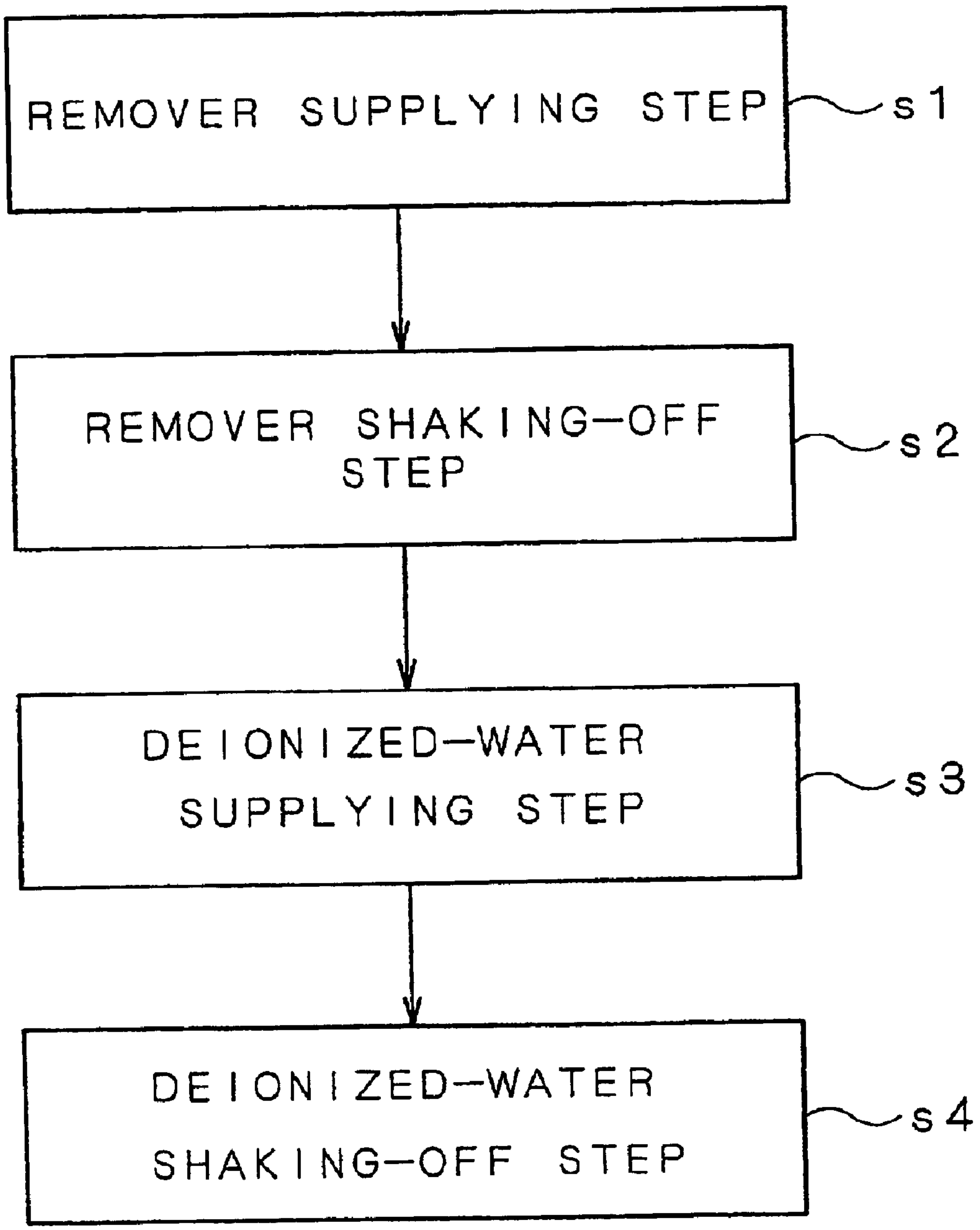
FIG. 6 is a flowchart of a substrate processing method of the first preferred embodiment of the present invention.
Figure 7:
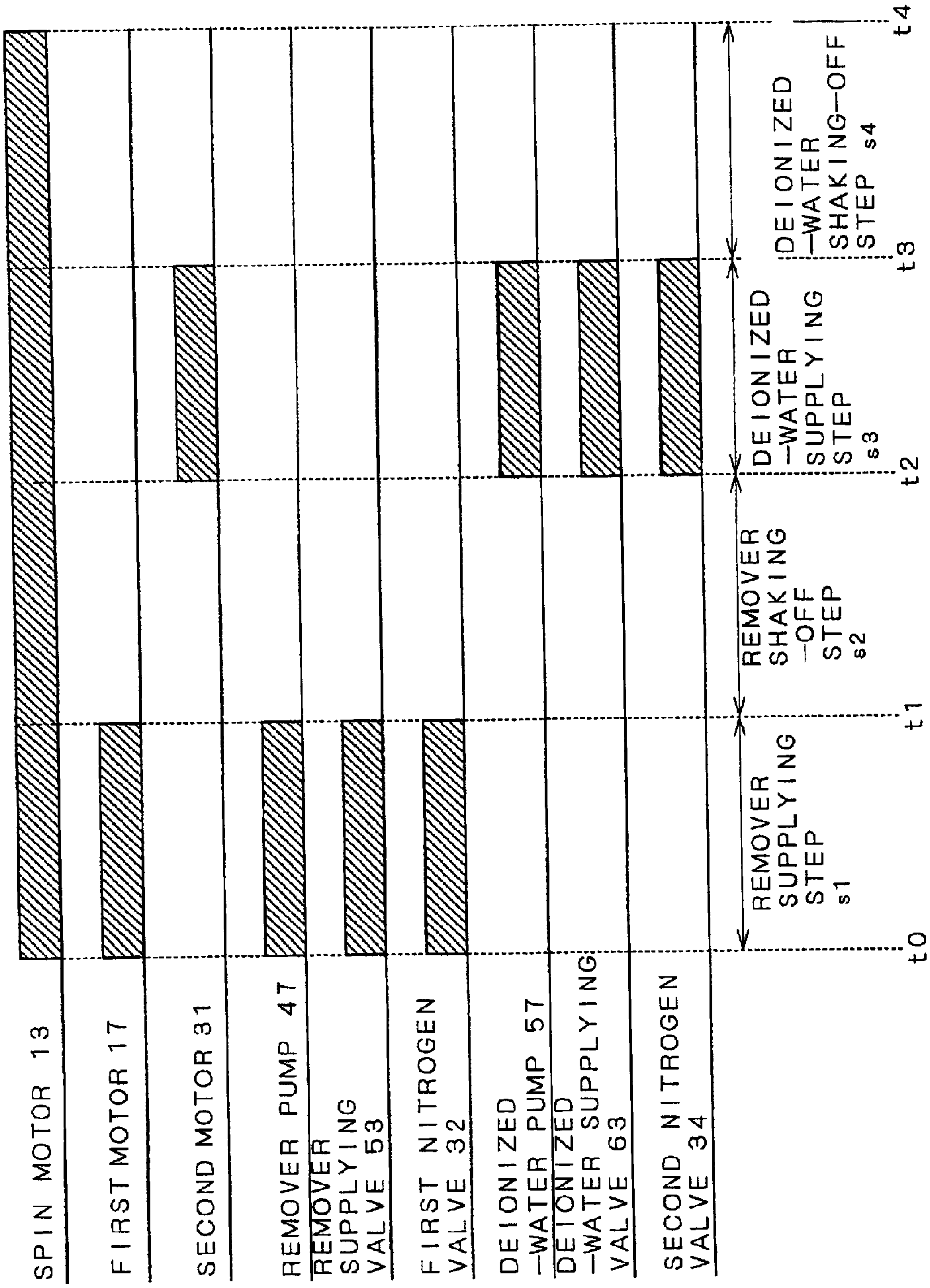
FIG. 7 is a detailed diagram of a flow of the substrate processing method of the first preferred embodiment of the present invention.

FIG. 6 is an illustration showing the first preferred embodiment of a substrate processing method using the above substrate processing apparatus 1. As shown in FIG. 6, the substrate processing method of this preferred embodiment comprises a remover supplying step s1, a remover shaking-off step s2, a deionized-water supplying step s3, and a deionized-water shaking-off step s4. These steps are described below by referring to FIG. 7.

(1. Remover Supplying Step s1)

First, the controlling means 69 controls the temperature controllers 51 and 61 by the time t0 so that temperatures of a remover and deionized water respectively reach a predetermined value. Moreover, the first nitrogen valve 32 and second nitrogen valve 34 are kept close.

Furthermore, the controlling means 69 drives the spin motor 13 to rotate the substrate W by the time t0 and the substrate W rotates at a predetermined number of revolutions at the time t0. Moreover, the controlling means 69 starts exhausting from the exhaust port 6 by the time t0 and aspirates the atmosphere nearby the substrate W.

Then, at the time t0, the controlling means 69 rotates the first motor 17 to rotate the remover nozzle body 23 on the substrate W reciprocally.

Moreover, the controlling means 69 discharges a remover toward the remover nozzle body 23 by driving the remover pump 47, opens the remover supplying valve 53, and supplies the remover from the remover supplying section 7 to the substrate W. Thereby, the remover supplied from the remover supplying section 7 is supplied onto the substrate W so that the arrival point to the substrate W moves on a circular arc passing through the rotation center C of the substrate W on the horizontal plane including the surface of the substrate W as shown by the arrow 85 in FIG. 2. Moreover, at the time t0, the controlling means 69 opens the first nitrogen valve 32.

According to the above described, the remover is supplied to the substrate W while nitrogen is blown onto the substrate W from the remover nozzle body 23. Moreover, because the atmosphere nearby the substrate W is aspirated from the exhaust port 6, the nitrogen blown from the remover nozzle body 23 moves along the surface of the substrate W and is aspirated into the exhaust port 6. Thereby, because the surface of the substrate W is successively covered with nitrogen which is an inert gas, a thin film on the substrate W is prevented from being changed in quality.

Thus, the remover supplying step s1 is executed. The controlling means 69 stops driving the first motor 17 at the time t1 after a predetermined time elapses from the time t0 while the remover nozzle body 23 escapes from the upper portion of the cup 3. Moreover, the controlling means 69 closes both the remover supplying valve 53 and first nitrogen valve 32 and stops driving the remover pump 47 and supplying the remover from the remover nozzle body 23.

(2. Remover Shaking-off Step s2)

Then, the control means 69 stops supplying the remover to the substrate W at the time t1 while it continuously rotates the spin motor 13 to keep the state of rotating the substrate W. Thereby, the remover-shaking-off step s2 for shaking off the remover from the substrate W is executed.

In the remover shaking-off step s2, the substrate W is rotated at 500 rpm or more, preferably rotated at 1,000 to 4,000 rpm. Moreover, it is preferable to keep rotation for 1 sec or more, preferably for 2 to 5 sec.

Thus, because the substrate W continuously rotates while supply of the remover to the substrate W is stopped, the remover on the substrate W is shook off from the surface of the substrate W by a centrifugal force.

(3. Deionized-water Supplying Step s3)

Then, at the time t2, the controlling means 69 rotates the second motor 31 to rotate the deionized-water nozzle body 37 reciprocally.

Moreover, at the time t2, the controlling means 69 drives the deionized-water pump 57 and thereby discharges deionized water toward the deionized-water nozzle body 37, opens the deionized-water supplying valve 63, and supplies deionized water from the deionized-water supplying section 9. Thereby, the deionized water supplied from the deionized-water nozzle body 37 is supplied onto the substrate W so that the arrival point to the substrate W moves on a circular arc passing through the rotation center C of the substrate W on a horizontal plane including the surface of the substrate W as shown by the arrow 87 in FIG. 2. Moreover, at the time t2, the controlling means 69 opens the second nitrogen valve 34.

According to the above described, deionized water is supplied to the substrate W while nitrogen is blown onto the substrate W from the deionized-water nozzle body 37. Moreover, because the atmosphere nearby the substrate W is aspirated from the exhaust port 6, the nitrogen blown out of the deionized-water nozzle body 37 moves along the surface of the substrate W and then it is aspirated into the exhaust port 6. Thereby, because the surface of the substrate W is covered with nitrogen which is an inert gas, a thin film on the substrate W is prevented from being changed in quality. Thus, the deionized-water supplying step s3 is executed.

At the time t3 after a predetermined time elapses, the controlling means 69 stops driving the second motor 31 while the deionized-water nozzle body 37 escapes from the upper portion of the cup 3. Moreover, the controlling means 69 closes the deionized-water supplying valve 63 and second nitrogen valve 34 and stops driving the deionized-water pump 57 and supplying deionized water from the deionized-water nozzle body 37. Furthermore, the controlling means 69 stops exhausting from the exhaust port 6.

(4. Deionized-water Shaking-off Step s4)

At the time t3, the controlling means 69 stops supplying deionized water while it continuously rotates the spin motor 13 to keep the state of rotating the substrate W. Thus, the deionized-water shaking-off step s4 is executed.

Because a remover and deionized water are supplied to the substrate W as described above, reaction products are removed.

According to the substrate processing method of this preferred embodiment, nitrogen is also continuously supplied to the substrate W while a remover is supplied to the substrate W in the remover supplying step s1. Therefore, it is possible to suppress the contact between a thin film and the atmosphere and prevent the thin film from being changed in quality. Moreover, in the deionized-water supplying step s3, nitrogen is also continuously supplied to the substrate W while deionized water is supplied to the substrate W. Therefore, it is possible to suppress the contact between a thin film and the atmosphere and prevent the thin film from being changed in quality.

According to the substrate processing method of this preferred embodiment, a remover on the substrate W is shook off in the remover shaking-off step s2 and thereby, a small or no amount of the remover is left on the substrate W. Therefore, by supplying deionized water to the substrate W under the above state in the deionized-water supplying step s3, the quantity of the remover with which deionized water contacts slightly or completely decreases. Therefore, pH-shock hardly influences the substrate W or it does not occur. Therefore, an intermediate rinsing step is unnecessary and throughput is improved. Moreover, by omitting the intermediate rinsing step, it is possible to reduce cost and an organic solvent used for the intermediate rinsing step is unnecessary. Therefore, it is also possible to improve the safety of the apparatus.

PH-shock denotes that strong alkali is produced when a remover contacts deionized water. It is known that the produced strong alkali damages a metallic film.

Though the first preferred embodiment of the above substrate processing method reciprocates the remover nozzle body 23 and deionized-water nozzle body 37 relatively to the substrate W, the following way is also allowed.

That is, it is allowed to rotate the first motor 17, set the remover nozzle body 23 (more minutely, the remover supplying tube 29) immediately above the rotation center C of the substrate W by the time t0, and supply a remover to the rotation center C of the currently rotating substrate W and supply nitrogen from the first gas supplying tube 27 at the time t0. Then, it is allowed to supply the remover to the rotation center C of the currently rotating substrate W and supply nitrogen from the first gas supplying tube 27 while stopping the remover nozzle body 23 up to the time t1.

Furthermore, it is allowed to rotate the second motor 31 and set the deionized-water nozzle body 37 (more minutely, the deionized-water supplying tube 43) immediately above the rotation center C of the substrate W by the time t2, and supply deionized water to the rotation center C of the currently rotating substrate W and supply nitrogen from the second gas supplying tube 41 at the time t2. Then, it is allowed to supply deionized water to the rotation center C of the currently rotating substrate W and supply nitrogen from the second gas supplying tube 41 while stopping the deionized-water nozzle body 37 up to the time t3.

Thus, because nitrogen radially moves along the surface of the substrate W from the rotation center C of the substrate W, the upper portion of the substrate W is uniformly covered with a nitrogen atmosphere. Therefore, it is possible to effectively suppress the quality change of a thin film.

Moreover, in the case of the first preferred embodiment of the above substrate processing method, supply of nitrogen from the first gas supplying tube 27 is performed simultaneously with supply of a remover from the remover supplying tube 29. However, it is not necessary to perform the supplies at the same time.

That is, it is allowed to supply nitrogen from the first gas supplying tube 27 before supplying a remover from the remover supplying tube 29. In this case, a remover is supplied after the surface of the substrate W is brought into a nitrogen atmosphere. Therefore, because the surface of the substrate W is brought into the nitrogen atmosphere before removal of reaction products is started from the surface of the substrate W, it is possible to effectively suppress the quality change of a thin film.

Moreover, it is allowed to start supplying a remover from the remover supplying tube 29 before supplying nitrogen from the first gas supplying tube 27. In this case, the remover is supplied to the substrate W while the surface of the substrate W is put in an atmospheric atmosphere for a certain period. However, a certain type of a remover can quickly remove reaction products in an atmospheric atmosphere compared to the case of a nitrogen atmosphere.

When using the above type of the remover, it is preferable to previously calculate the removal start time up to the start of removal of reaction products from the surface of the substrate W through experiments or the like. Then, it is preferable to start supplying a remover from the remover supplying tube 29 at the time t0 and after the removal start time elapses, start supplying nitrogen from the first gas supplying tube 27.

Thus, it is possible to quickly remove reaction products and suppress the quality change of a thin film.

Moreover, in the case of the first preferred embodiment of the above substrate processing apparatus, a remover is supplied from an inner tube and nitrogen from an outer tube by the remover nozzle body 23 of the substrate processing apparatus 1. Therefore, when supplying a remover and nitrogen to the substrate W, a layer of the remover is smoothly formed immediately on the substrate W and a layer of the nitrogen is smoothly formed on the remover layer. Therefore, the remover on the substrate W is isolated from the atmosphere by the nitrogen layer and it is also possible to suppress the quality change of the remover due to an atmospheric atmosphere.

Though the remover nozzle body 23 of the above substrate processing apparatus 1 supplies the remover from the inner tube and nitrogen from the outer tube to the substrate W. However, it is also allowed to supply the nitrogen from the inner tube and the remover from the outer tube.

Moreover, in the case of the deionized-water nozzle body 37, it is allowed to supply nitrogen from an inner tube and deionized water from an outer tube.

Furthermore, though the remover nozzle body 23 of the above substrate processing apparatus 1 uses a double-tube structure, it is also allowed to separately set a tube for discharging a remover and a tube for blowing nitrogen at the front end of the first arm 21.

<3. Second Preferred Embodiment of Substrate Processing Apparatus>

Second preferred embodiment of a substrate processing apparatus of the present invention is described below by referring to FIGS. 8 and 9. Though FIG. 8 is a sectional view taken along the line VIII—VIII in FIG. 9, hatching is locally omitted for convenience's sake.

A substrate processing apparatus 100 of the second preferred embodiment has a solvent supplying section 2 serving as an intermediate rinse supplying section in addition to the substrate processing apparatus 1 of the first preferred embodiment.

The substrate processing apparatus 100 of the second preferred embodiment has many portions common to those of the substrate processing apparatus 1 of the first preferred embodiment. Therefore, portions common to those of the substrate processing apparatus 1 are provided with the same reference numbers and their descriptions are omitted.

Figure 8:
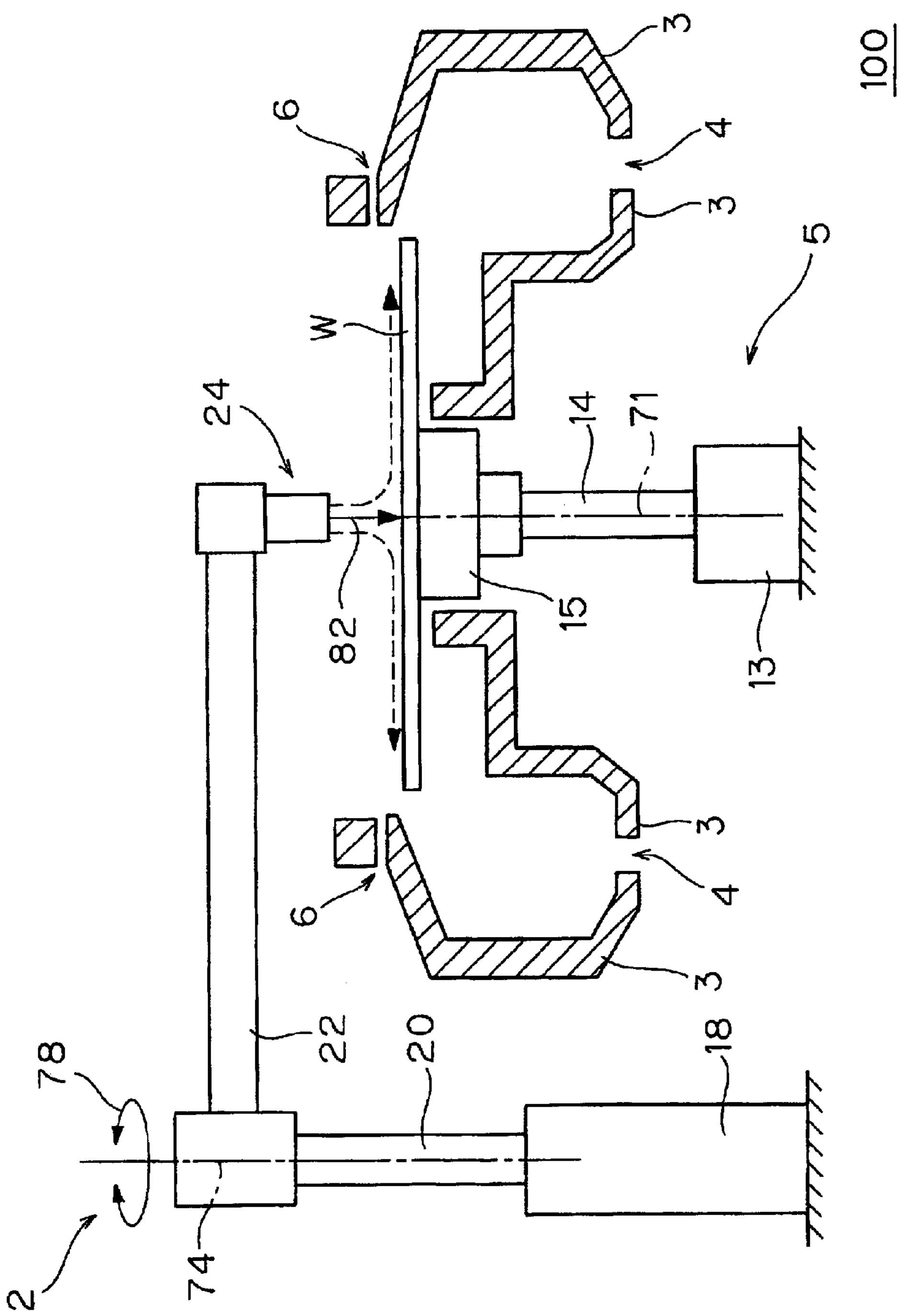
FIG. 8 is a side view of a substrate processing apparatus of a second preferred embodiment of the present invention.

As shown in FIG. 8, the substrate processing apparatus 100 has a solvent supplying section 2.

The solver supplying section 2 has a driving shaft vertically set and moreover has a third motor 18 fixed to a not-illustrated machine casing, a third rotation shaft 20 fixed to the driving shaft of the third motor 18, a third arm 22 connected to the top of the third rotation shaft 20, and a solvent nozzle body 24 set to the front end of the third arm 22.

The above-described double-tube nozzle 16 is applied to the solvent nozzle body 24, in which an inner tube 42 is set to a solvent supplying tube 30 and an outer tube 38 is set to a third gas supplying tube. Moreover, the solvent nozzle body 24 is fixed to the third arm 22 while vertically setting the axial directions of the inner tube 42 and outer tube 38.

Figure 9:
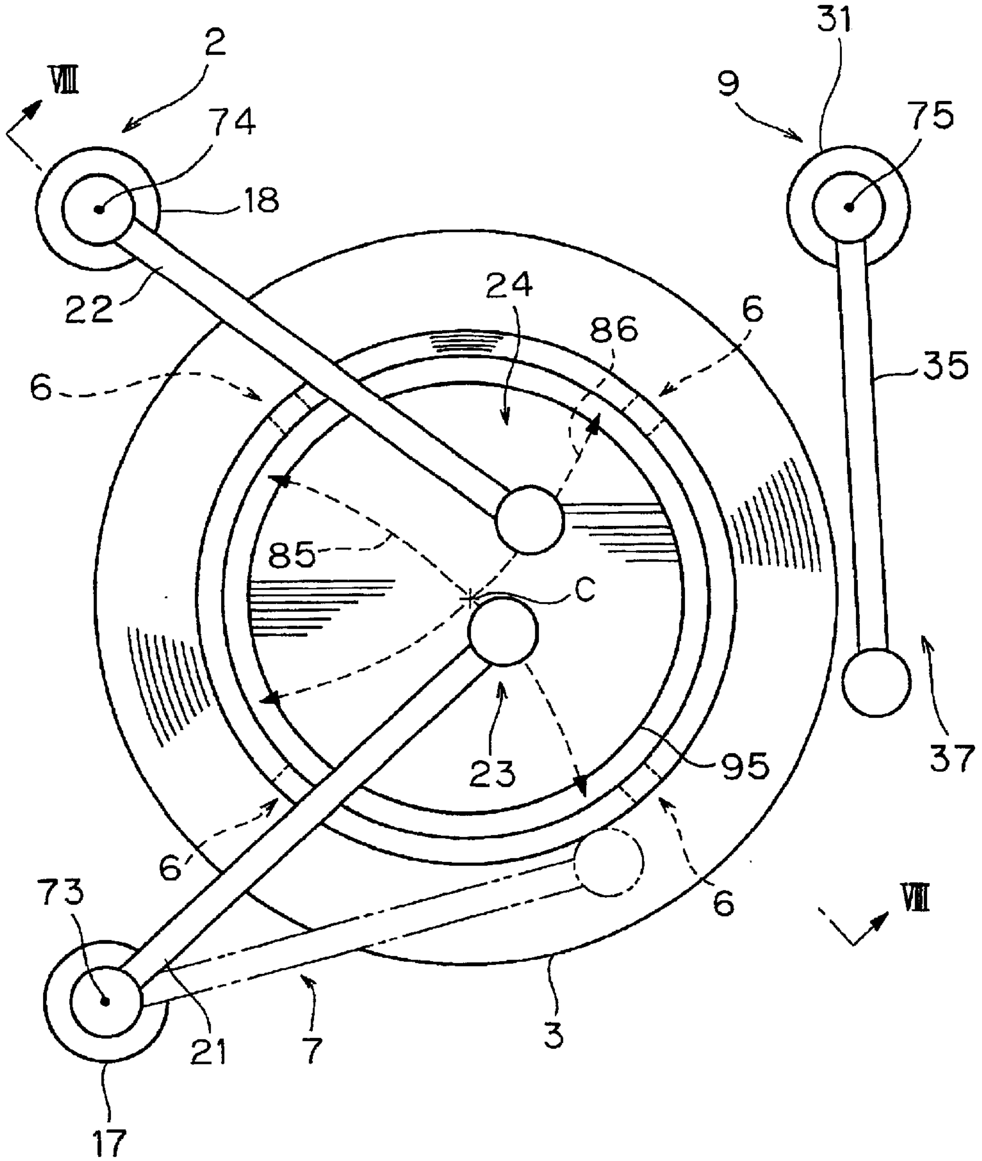
FIG. 9 is a top view of the substrate processing apparatus of the second preferred embodiment of the present invention.

Furthermore, the solvent nozzle body 24 is fixed to the third arm 22 so that an organic solvent 82 discharged from the solvent nozzle body 24 moves on a circular arc 86 in FIG. 9 when the third arm 22 reciprocally rotates about an axis 74 as shown by an arrow 78. In this case, the circular arc 86 is a circular arc passing through the rotation center C of the substrate W and intersecting at two points on the circumference of a turning circle 95 which is drawn by a locus of the edge of the rotated substrate W.

<3-1. Solvent Supplying System 90>

Figure 10:
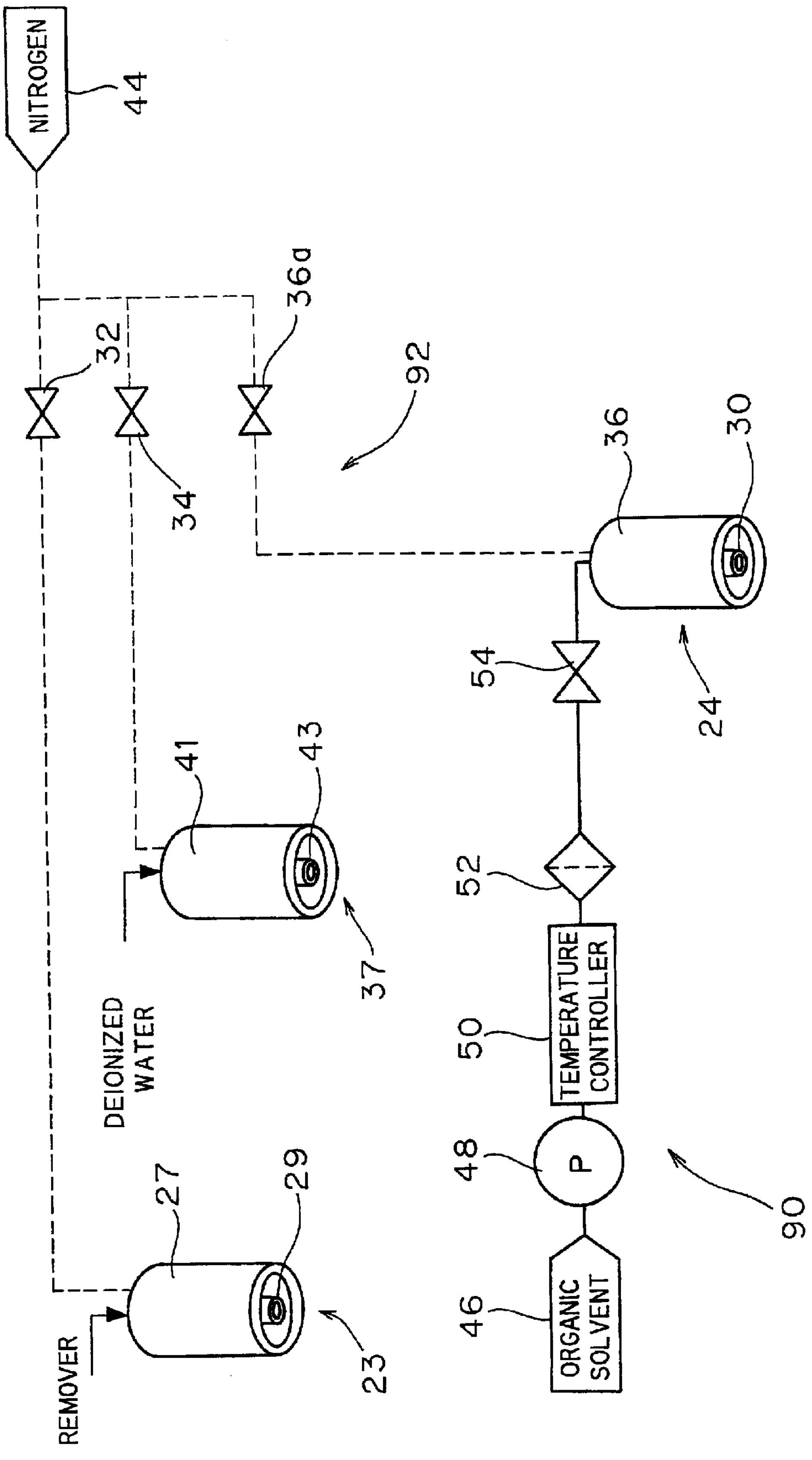
FIG. 10 is a piping diagram of the substrate processing apparatus of the second preferred embodiment of the present invention.

FIG. 10 shows a solvent supplying system 90 for supplying an organic solvent to a solvent supplying section 2. The solvent supplying system 90 has a solvent pump 48 for pumping out an organic solvent from a solvent source 46 outside of the apparatus, a temperature controller 50 for controlling the temperature of the organic solvent to a predetermined temperature by heating or cooling the organic solvent pumped out by the solvent pump 48, a filter 52 for filtering contaminants from the organic solvent temperature-controlled by the temperature controller 50, and a solvent supplying valve 54 for opening or closing the channel of the filtered organic solvent to the solvent nozzle body 24.

According to the above configuration, the solvent supplying system 90 supplies the organic solvent temperature-controlled to a predetermined temperature by the temperature controller 50 and purified by the filter 52 to the solvent nozzle body 24.

Then, a gas supplying section 92 is described below by referring to FIG. 10.

The gas supplying section 92 has a third nitrogen valve 36*a* inserted into a duct extended from the nitrogen source 44 to a third gas supplying tube 36 serving as the outer tube of the solvent nozzle body 24 in addition to the configuration of the substrate processing apparatus 1 of the first preferred embodiment. According to the above configuration, it is possible to execute or stop blowing nitrogen from the solvent nozzle body 24 by opening or closing the third nitrogen valve 36*a*.

Figure 11:
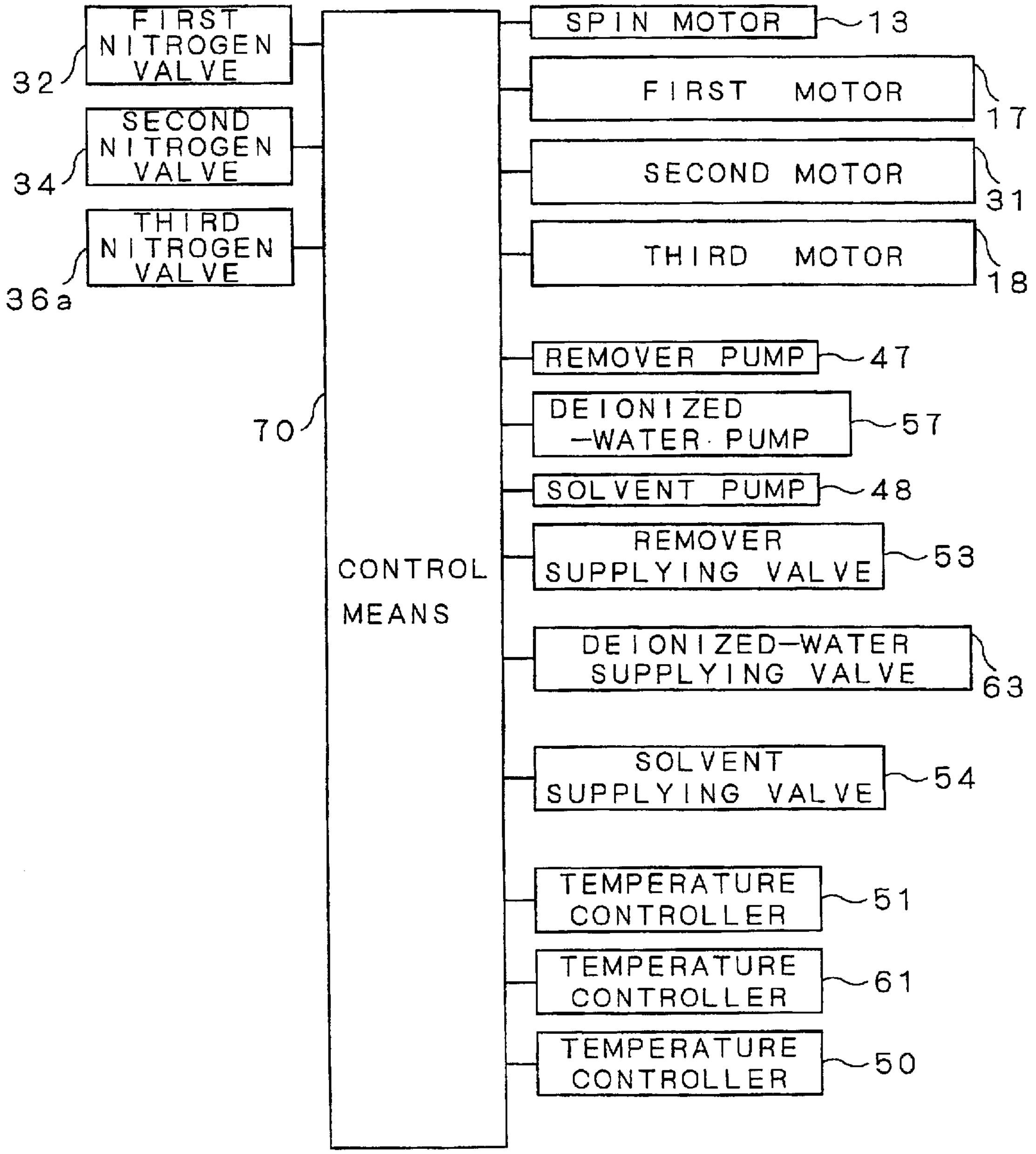
FIG. 11 is an illustration showing an electrical configuration of the substrate processing apparatus of the second preferred embodiment of the present invention.

Then, an electrical configuration of the substrate processing apparatus 10 is described below by referring to FIG. 11.

Similarly to the case of the control means 69 of the first preferred embodiment, control means 70 connects with a spin motor 13, a first motor 17, a second motor 31, a remover pump 47, a deionized-water pump 57, a remover supplying valve 53, a deionized-water supplying valve 63, a temperature controller 51, a temperature controller 61, a first nitrogen valve 32, and a second nitrogen valve 34.

Furthermore, the control means 70 connects with a third motor 18, a solvent pump 48, a solvent supply valve 54, a temperature controller 50, a third nitrogen valve 36*a*.

Moreover, the control means 70 controls these connected units as described for the second preferred embodiment of a substrate processing method to be described later.

<4. Second Preferred Embodiment of Substrate Processing Method>

Figure 12:
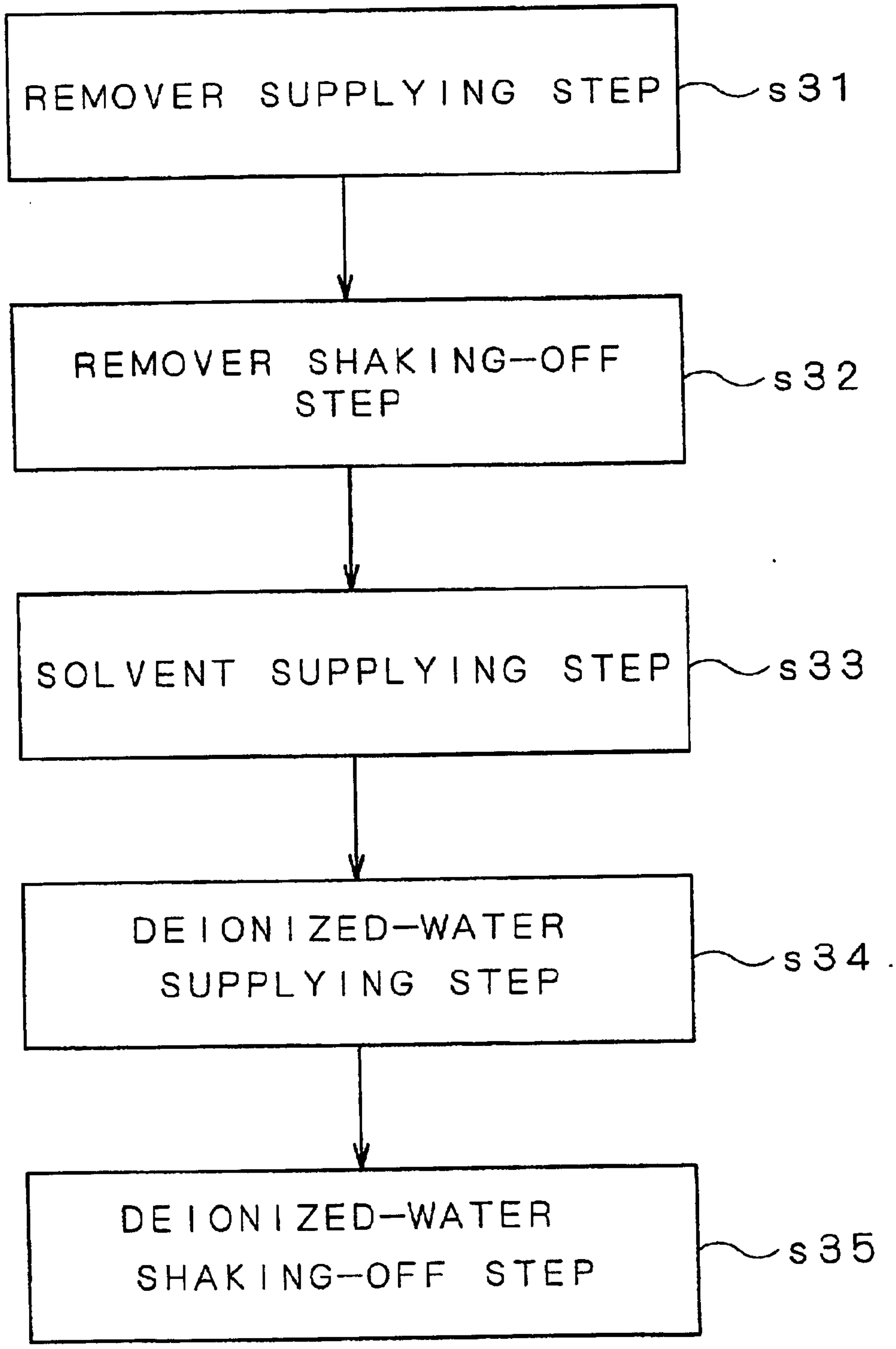
FIG. 12 is a flowchart of a substrate processing method of the second preferred embodiment of the present invention.

Second preferred embodiment of a substrate processing method using the above substrate processing apparatus 100 is described below by referring to FIG. 12.

The substrate processing method of this preferred embodiment comprises a remover supplying step s31, a remover shaking-off step s32, a solvent supplying step s33 serving as an intermediate rinsing step, a deionized-water supplying step s34, and a deionized-water shaking-off step s35.

The substrate processing method of this preferred embodiment is constituted by substantially adding a solvent supplying step between the remover shaking-off step s2 and the deionized-water supplying step s3 of the substrate processing method of the first preferred embodiment comprising the remover supplying step s1, remover shaking-off step s2, deionized-water supplying step s3, and deionized-water shaking-off step s4.

Therefore, because the remover supplying step s31, remover shaking-off step s32, deionized-water supplying step s34, and deionized-water shaking-off step s35 are the same as the remover supplying step s1, remover shaking-off step s2, deionized-water supplying step s3, and deionized-water shaking-off step s4 of the substrate processing method of the first preferred embodiment, their descriptions are omitted.

Then, the solvent supplying step s33 of this preferred embodiment is described below.

Figure 13:
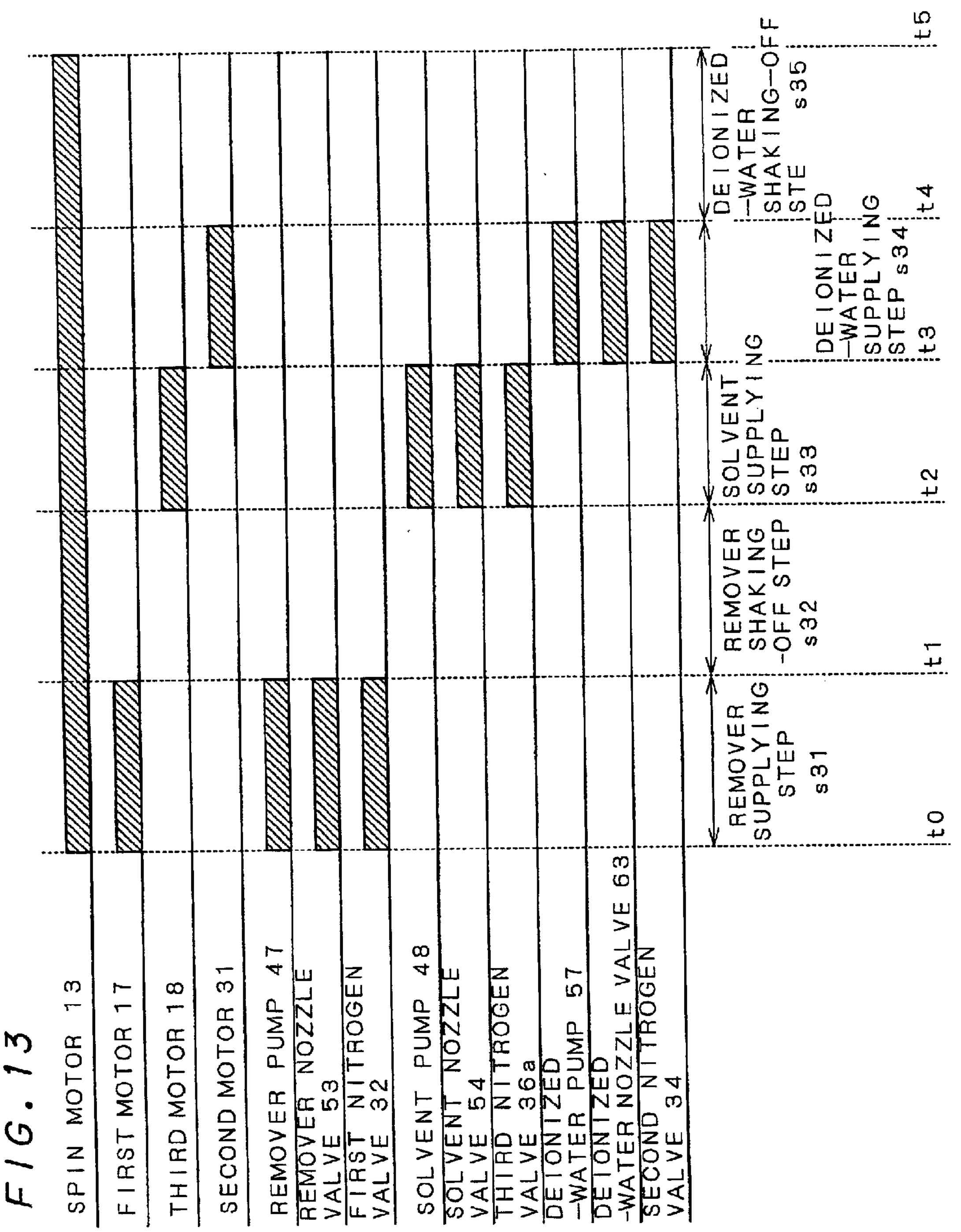
FIG. 13 is a detailed diagram of a flow of the substrate processing method of the second preferred embodiment of the present invention.

As shown in FIG. 13, the solvent supplying step s33 is executed after the remover supplying step s31 and remove shaking-off step s32. Because the substrate W continuously rotates while stopping the supply of a remover to the substrate W in the remover shaking-off step s32, the remover on the substrate W is shook off from the substrate W by a centrifugal force and thereby, the remover remaining on the substrate W is unlimitedly decreased. Moreover, the solvent supplying valve 54 and third nitrogen valve 36*a* are closed before the time t0 and the temperature controller 50 keeps an organic solvent at a predetermined temperature.

Then, at the time t2, the control means 70 rotates the third motor 18 and the solvent nozzle body 24.

Moreover, at the time t2, the control means 70 drives the solvent pump 48 and thereby discharges an organic solvent toward the solvent nozzle body 24, opens the solvent supplying valve 54, and supplies the organic solvent from the solvent supplying section 2.

Thereby, the organic solvent supplied from the solvent supplying section 2 (more minutely, the solvent nozzle body 24) is supplied onto the substrate W so that the arrival point to the substrate W moves on a circular arc passing through the rotation center C of the substrate W on a horizontal plane including the surface of the substrate W as shown by an arrow 86 in FIG. 9.

Moreover, the control means 70 opens the third nitrogen valve 36*a*. Thereby, a solvent is supplied to the substrate W while nitrogen is blown from the solvent nozzle body 24. Moreover, because the atmosphere nearby the substrate W is aspirated from the exhaust port 6, the nitrogen flown out of the solvent nozzle body 24 moves along the surface of the substrate W and then it is aspirated into the exhaust port 6. Thereby, the surface of the substrate W is covered with nitrogen that is an inert gas and thereby the quality change of a thin film on the substrate W is suppressed.

Thus, in the solvent supplying step s33, a remover is completely washed away from the substrate W by supplying an organic solvent to the substrate W. Therefore, when deionized water is supplied to the substrate W in the subsequent deionized-water supplying step s34, no remover contacts deionized water and thereby, it is possible to prevent pH-shock from occurring. Therefore, it is possible to prevent a thin film on the substrate W from being damaged.

<5. Third Preferred Embodiment of Substrate Processing Apparatus>

Third preferred embodiment of a substrate processing apparatus of the present invention is described below by referring to FIGS. 14 and 15. FIG. 15 is a top view of the preferred embodiment in FIG. 14.

In the case of the substrate processing apparatus 1 of the first preferred embodiment and the substrate processing apparatus 100 of the second preferred embodiment, a gas supplying tube is also mounted on an arm on which a nozzle for discharging treatment liquid such as the first arm 21, second arm 35, or third arm 22 is mounted. In the case of the substrate processing apparatus 200 of the third preferred embodiment, however, a gas supplying tube is not mounted on such an arm but nitrogen-blowing means is set nearby a substrate W instead.

The substrate processing apparatus 200 is different from the substrate processing apparatus 100 of the second preferred embodiment in that a solvent nozzle body and a deionized-water nozzle body are mounted on one arm. However, because a holding-and-rotating section, a remover supplying system, a solvent supplying system, and a deionized-water supplying system substantially have the same configurations as those of the second preferred embodiment, their descriptions are omitted.

Figure 14:
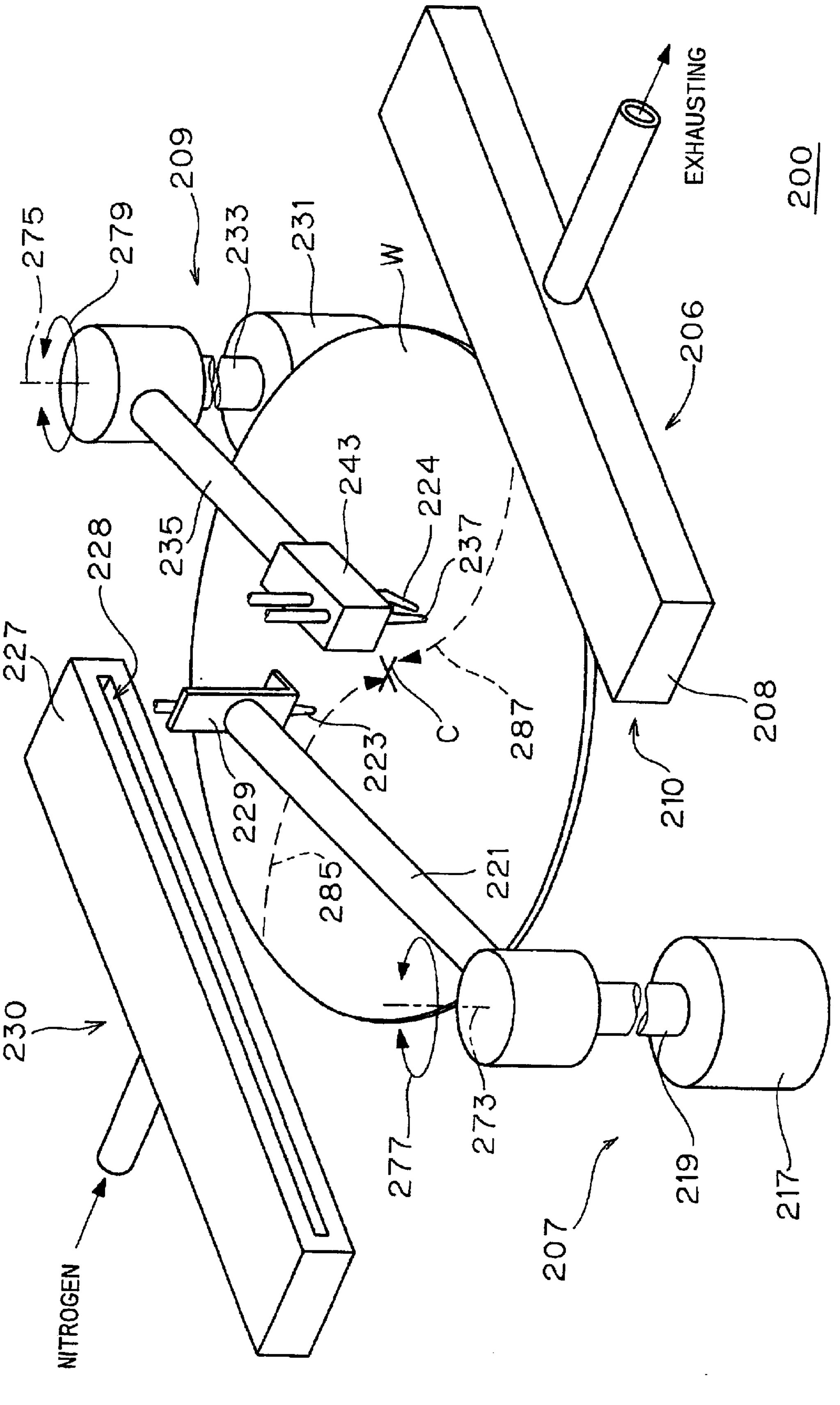
FIG. 14 is a perspective view of a substrate processing apparatus of a third preferred embodiment of the present invention.
Figure 15:
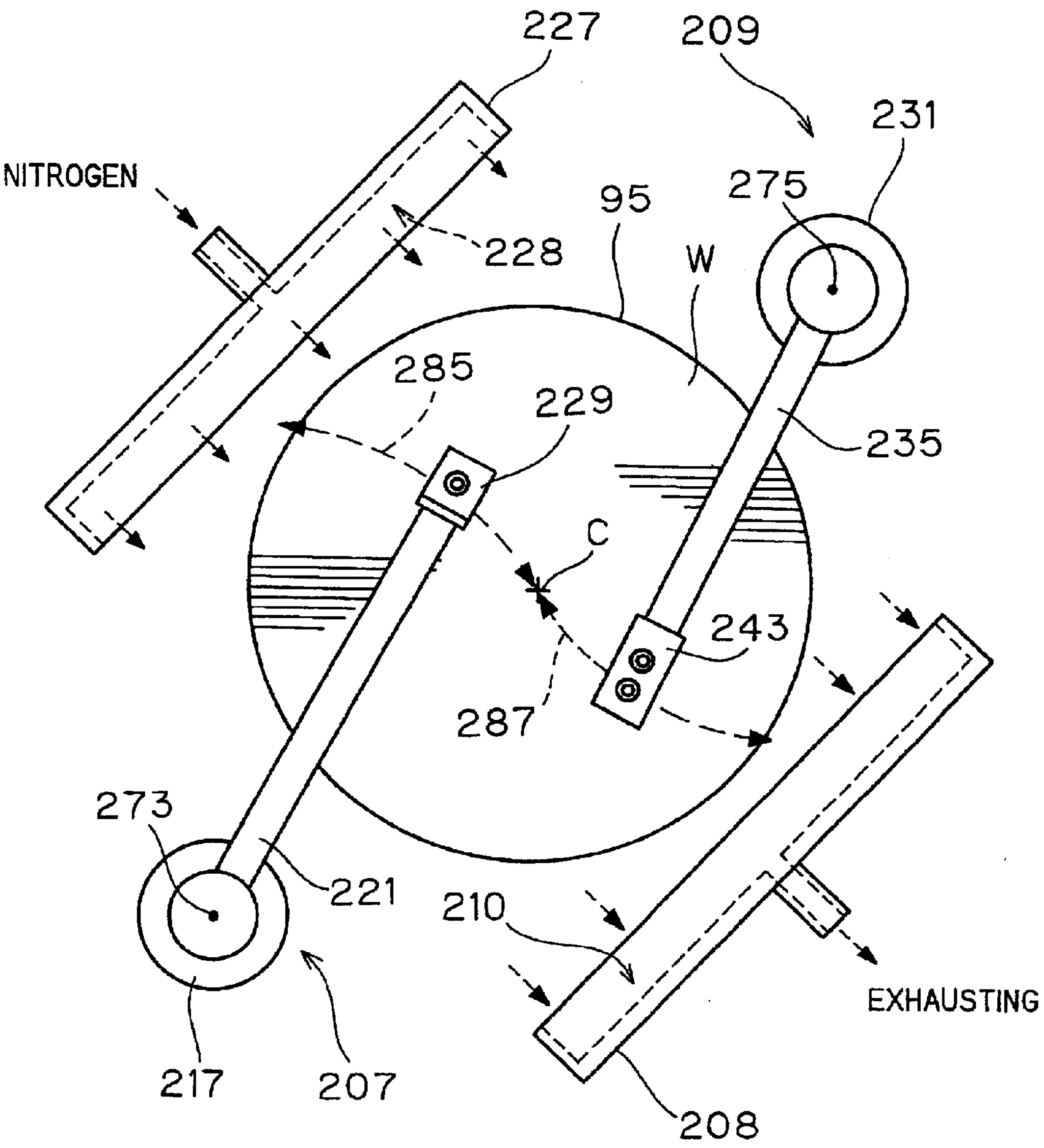
FIG. 15 is a top view of the substrate processing apparatus of the third preferred embodiment of the present invention.
Figure 16A:
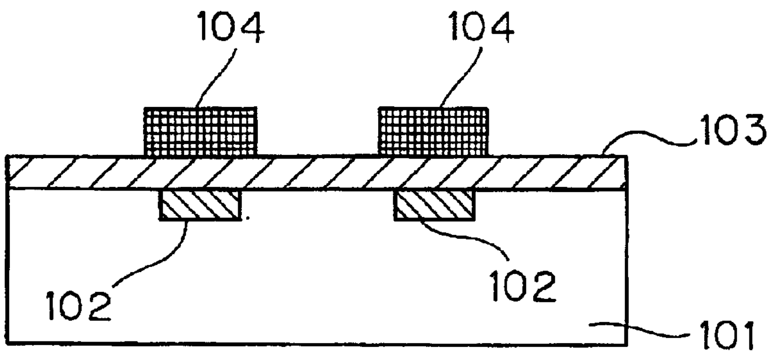
FIGS. 16A, 16B and 16C are illustrations for explaining the background art.
Figure 16B:
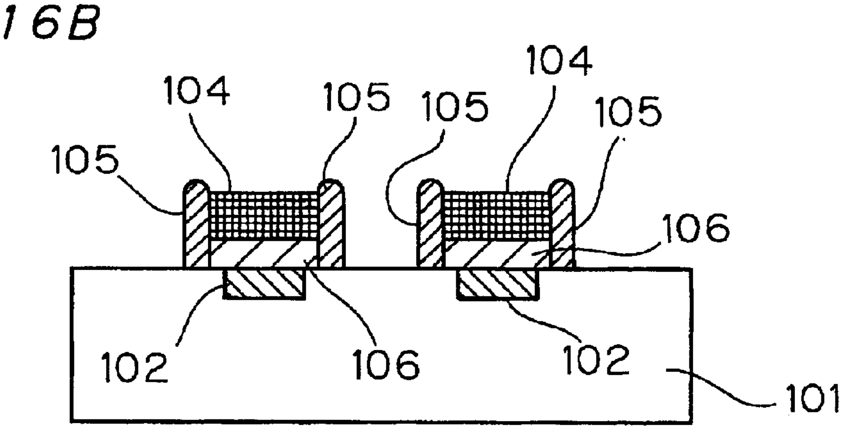
Figure 16C:
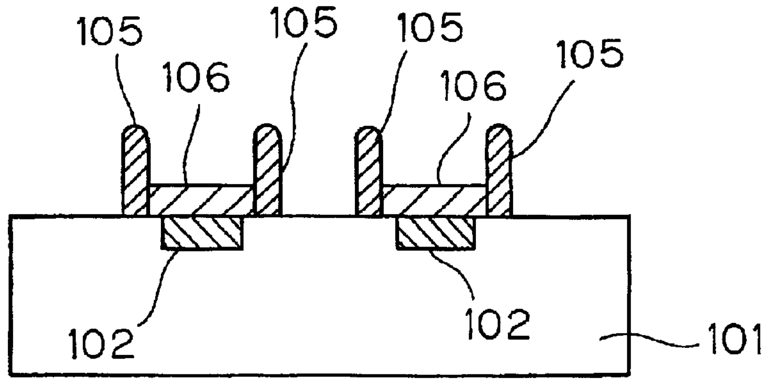

As shown in FIG. 14, the substrate processing apparatus 200 has a remover supplying section 207 for supplying a remover to the substrate W, a solvent and deionized-water supplying section 209 for supplying an organic solvent and deionized water to the substrate W, and gas blowing means 230 and gas aspirating means 206. Moreover, though not illustrated, the substrate W is held by the holding-and-rotating section similarly to the case of the substrate processing apparatus 100.

The remover supplying section 207 has a first motor 217 which is fixed to a not-illustrated machine casing and has a driving shaft vertically set, a first rotation shaft 219 fixed to the driving shaft of the first motor 217, and a first arm 221 connected to the top of the first rotation shaft 219.

A first fixed block 229 is set to the front end of the first arm 221 and a remover nozzle body 223 is set to the first fixed block 229.

The remover nozzle body 223 is a tubular member vertically set, in which an opening oriented to the substrate W is formed on one end and a remover is supplied to the other end from a remover supplying system. Thereby, the remover nozzle body 223 discharges a remover to the substrate W.

In the case of this preferred embodiment, as shown by the arrow 285 in FIG. 15, the remover nozzle body 223 is moved so that the arrival point of a remover to the substrate W moves on a circular arc using the radius of a turning circle 95 drawn by rotation of the edge of the substrate W as a chord.

The solvent and deionized-water supplying section 209 has a second motor 231 which is fixed to a not-illustrated machine casing and has a driving shaft vertically set, a second rotation shaft 233 fixed to the driving shaft of the second motor 231, and a second arm 235 connected to the top of the second rotation shaft 233.

A second fixed block 243 is set to the front end of the second arm 235 and a deionized-water nozzle body 237 and a solvent nozzle body 224 are set to the second fixed block 243.

The deionized-water nozzle body 237 is a tubular member vertically set, in which an opening oriented to the substrate W is formed on one end and deionized water is supplied to the other end from a deionized-water supplying system. Thereby, the deionized-water nozzle body 237 discharges deionized water to the substrate W.

The solvent nozzle body 224 is a tubular member in which an opening oriented to the substrate W is formed on one end and an organic solvent is supplied to the other end from a solvent supplying system. Thereby, the solvent nozzle body 224 discharges an organic solvent to the substrate W. The front end of the solvent nozzle body 224 is bent in the direction in which the deionized-water nozzle body 237 is present. Minutely, the front end of the solvent nozzle body 224 is bent so that the arrival point of an organic solvent discharged from the solvent nozzle body 224 to the substrate W become equal to the arrival point of deionized water discharged from the deionized-water nozzle body 237 to the substrate W. According to the above configuration, an organic solvent and deionized water supplied from the solvent and deionized-water supplying section 209 arrive at the same position on the substrate W.

In the case of this preferred embodiment, the solvent nozzle body 224 and deionized-water nozzle body 237 are moved so that arrival points of deionized water and an organic solvent to the substrate W move on a circular arc using the radius of the turning circle 95 drawn by rotation of the edge of the substrate W as a chord as shown by the arrow 287 in FIG. 15.

The gas blowing means 230 has a gas nozzle 227 on which a slot-like (slit-like) gas blowing port 228 extending in the extending direction of the surface of the substrate W or almost horizontal direction in this case is formed. The gas nozzle 227 is set so that the gas blowing port 228 becomes almost the same height and position as the substrate W nearby the substrate W. Moreover, nitrogen is supplied to the gas nozzle 227 and thereby, a nitrogen gas is blown toward the substrate W from the gas blowing port 228.

The aspirating means 206 has an aspiration nozzle 208. The aspiration nozzle 208 has a slot-like aspiration port 210 extending in the extending direction of the surface of the substrate W or almost horizontal direction in this case. Moreover, because the aspiration nozzle 208 is exhausted, the atmosphere nearby the substrate W is aspirated into the aspiration port 210.

The above substrate processing apparatus 200 executes a remover supplying step of supplying a remover to the currently-rotating substrate W from the remover nozzle body 223 while rotating the substrate W and reciprocating the remove nozzle body 223 while blowing nitrogen from the gas blowing means 230 simultaneously with the supply of a remover and aspirating the atmosphere nearby the substrate W by the aspirating means 206.

Thereby, the nitrogen supplied from the gas blowing means 230 flows on the surface of the substrate W and is aspirated into the aspirating means 206 and the surface of the substrate W is covered with a nitrogen atmosphere. Moreover, a remover is supplied to the substrate W while the surface of the substrate W is covered with the nitrogen atmosphere.

Therefore, it is possible to suppress the quality change of a thin film on the substrate W due to the atmosphere.

After the remover supplying step is completed, a solvent supplying step is executed in which supply of a remover is stopped to supply an organic solvent from the solvent nozzle 224 while continuing supply of nitrogen from the gas blowing means 230, aspiration of atmosphere from the aspirating means 206, and rotation of the substrate W.

After the solvent supplying step is completed, a deionized-water supplying step is executed in which supply of an organic solvent is stopped to supply deionized water from the deionized-water nozzle body 237 while continuing supply of nitrogen from the gas blowing means 230, aspiration of atmosphere from the aspirating means 206, and rotation of the substrate W.

After the deionized-water supplying step is completed, supply of deionized water is stopped while continuing supply of nitrogen from the gas blowing means 230, aspiration of atmosphere from the aspirating means 206, and rotation of the substrate W. Thereby, a deionized-water shaking-off step for the substrate W is executed under a nitrogen atmosphere.

As described above, in the case of the substrate processing apparatus 200 of this preferred embodiment, nitrogen is blown out of the gas blowing means 230 and atmosphere is aspirated from the aspirating means 206 in all the remover supplying step, solvent supplying step, deionized-water supplying step, and deionized-water shaking-off step and periods between these steps. Therefore, because all processings of the substrate W can be executed under a nitrogen atmosphere, it is possible to preferably suppress the quality change of a thin film on the substrate W.

<6. Summary>

Though the holding-and-rotating section of each of the above preferred embodiments horizontally holds and rotates a substrate, it is also allowed to use a holding-and-rotating section for holding and rotating a substrate by tilting the main surface of the substrate from a horizontal plane or making the main surface of the substrate parallel with the vertical direction.

Moreover, though the holding-and-rotating section of each of the above preferred embodiments holds only one substrate, it is also allowed to use a holding-and-rotating section for holding a plurality of substrates.

Furthermore, the substrate processing of each of the above preferred embodiments purposes a substrate on whose surface a polymer is produced after undergoing dry etching. The substrate processing is particularly effective when purposing a substrate after undergoing the above dry etching and moreover ashing.

Ashing is performed by setting a substrate having a resist film in oxygen plasma. When undergoing ashing, a firmer polymer is produced. Therefore, when removing a polymer from a substrate undergoing dry etching and ashing, it is possible to improve the throughput and reduce the cost in accordance with the present invention.

Moreover, the substrate processing apparatus of each of the above preferred embodiments shows a particularly remarkable effect when a thin film on the substrate W is a metallic film. That is, metallic films are easily oxidized by oxygen in the atmosphere. Particularly, a metallic portion exposed because reaction products are removed is easily oxidized. This oxide deteriorates the quality of a substrate. However, because the substrate processing apparatus of each of the above preferred embodiments has a gas supplying section for supplying nitrogen which is an inert gas to a substrate, it is possible to suppress occurrence of oxides. Among the above metallic films, a copper (Cu) film is particularly extremely deteriorated in quality by oxidation. When removing reaction products from a substrate having a copper film or a copper wiring, the substrate processing apparatus of each of the above preferred embodiments shows a remarkable effect.

Moreover, though nitrogen is used for each of the above preferred embodiments as an inert gas, it is also possible to use argon as an inert gas.

In the case of the above preferred embodiments, it is disclosed to remove a polymer produced under dry etching from a substrate passing through a dry etching step. However, the present invention is not restricted to the case of removing the polymer from the substrate on which the polymer is present under dry etching.

For example, though previously described, the present invention includes a case of removing a polymer produced under plasma ashing from a substrate. Therefore, a case is also included in which a polymer produced due to a resist is removed from a substrate not only under dry etching but also under various processings.

Moreover, the present invention is not restricted to a case of removing only a polymer produced due to a processing through dry etching and plasma ashing but it includes a case of removing various reaction products due to a resist from a substrate.

Furthermore, the present invention is not restricted to a case of removing reaction products due to a resist from a substrate but it also includes a case of removing a resist from a substrate.

For example, a case is also included in which a resist film whose lower-layer processing is completed and thereby which becomes unnecessary is removed from a substrate to which a resist is applied, patterns including a wiring pattern are exposed to the resist, the resist is developed, and the lower layer of the resist is processed (for example, a thin film serving as the lower layer is etched).

In this case, it is possible to remove a reaction product produced due to the quality change of the resist film if any simultaneously when removing the unnecessary resist film. Therefore, the throughput is improved and the cost can be reduced. For example, when dry-etching the thin film serving as a lower layer in the above lower-layer processing, reaction products are also produced. Therefore, it is also possible to remove the resist film used to mask the lower layer under dry etching and reaction products produced due to the quality change of the resist film.

Moreover, the present invention is not restricted to a case of removing not only a reaction product resulting from a resist or the resist itself from a substrate but also an organic matter not resulting from a resist such as a fine contaminant produced by a human body from a substrate.

While the invention has been shown and described in detail, the foregoing description is in all aspects illustrative and not restrictive. It is therefore understood that numerous other modifications and variations can be devised without departing from the scope of the invention.

What is claimed is:

1. A substrate processing apparatus for removing an organic matter from a substrate by a remover for said organic matter, comprising:

a holding-and-rotating section for holding and rotating a substrate;

a remover supplying section for supplying a remover for removing an organic matter to the substrate held by said holding-and-rotating section; and a gas supplying section for supplying an inert gas to a surface of the substrate substantially concurrently with a supply of said remover to said substrate.

2. The substrate processing apparatus according to claim 1, wherein said remover supplying section bas a remover supplying tube for discharging a remover to a substrate, and said gas supplying section has a gas supplying tube for blowing an inert gas on said substrate.

3. The substrate processing apparatus according to claim 2, wherein said remover supplying tube is set in said gas supplying tube.

4. The substrate processing apparatus according to claim 3, further comprising:

an exhausting section set to a side of the substrate held by said holding-and-rotating section to exhaust a gas nearby said substrate.

5. The substrate processing apparatus according to claim 4, wherein said organic matter attached to said substrate is a reaction product produced when a resist film formed on said substrate changes in quality.

6. The substrate processing apparatus according to claim 5, wherein said reaction product is a polymer produced when a thin film present on the surface of said substrate is dry-etched by using said resist film as a mask.

7. The substrate processing apparatus according to claim 1, wherein said gas supplying section is provided with a gas nozzle having a slit-like gas-blowing port for blowing an inert gas along the surface of the substrate held by said holding-and-rotating section and said gas nozzle is set to a side of the substrate held by said holding-and-rotating section.

8. The substrate processing apparatus according to claim 7, further comprising:

an aspirating section for aspirating a gas nearby the substrate held by said holding-and-rotating section, said aspirating section being located opposite said gas nozzle with said substrate sandwiched in between.

9. The substrate processing apparatus according to claim 8, wherein said remover supplying section starts supplying a remover to a substrate and when a predetermined time elapses, said gas supplying section starts supplying an inert gas to said substrate.

10. The substrate processing apparatus according to claim 9, wherein said organic matter attached to said substrate is a reaction product produced when a resist film formed on said substrate changes in quality.

11. The substrate processing apparatus according to claim 10, wherein said reaction product is a polymer produced when a thin film present on the surface of said substrate is dry-etched by using said resist film as a mask.

12. The substrate processing apparatus according to claim 1, further comprising:

a controller for controlling said remover supplying section and said gas supplying section in such a manner that a supply period of said remover and a supply period of said inert gas to the substrate at least in part overlap.

13. The substrate processing apparatus according to claim 12, wherein said controller controls said remover supplying section and said gas supplying section in such a manner that said remover supplying section starts supplying a remover to a substrate and, when a predetermined time elapses, said gas supplying section starts supplying an inert gas to said substrate.

14. A substrate processing method for removing an organic matter from a substrate by a remover for said organic matter, comprising the steps of:

holding and rotating a substrate;

supplying a remover for removing an organic matter to said rotating substrate; and supplying an inert gas to a surface of the substrate substantially concurrently with said supplying of a remover.

15. The substrate processing apparatus according to claim 14, wherein it is started to supply a remover to said substrate and when a predetermined time elapses, it is started to supply an inert gas to said substrate.

16. The substrate processing apparatus according to claim 15, wherein said organic matter attached to said substrate is a reaction product produced when a resist film formed on said substrate changes in quality.

17. The substrate processing apparatus according to claim 16, wherein said reaction product is a polymer produced when a thin film present on the surface of said substrate is dry-etched by using said resist film as a mask.

18. The substrate processing apparatus according to claim 14, wherein a supply period of said remover and a supply period of said inert gas to the substrate at least in part overlap.

* * * * *